United States Patent
Hwang et al.

(10) Patent No.: US 10,915,024 B2
(45) Date of Patent: Feb. 9, 2021

(54) METHOD FOR MANUFACTURING PATTERN FOR ELECTRONIC DEVICES, AND FIBER-TYPE ELECTRONIC DEVICE COMPRISING THE PATTERN FOR ELECTRONIC DEVICES

(71) Applicant: KOREA INSTITUTE OF SCIENCE AND TECHNOLOGY, Seoul (KR)

(72) Inventors: Sunbin Hwang, Jeollabuk-do (KR); Dong Su Lee, Jeollabuk-do (KR); Dae-Young Jeon, Jeollabuk-do (KR); Sukang Bae, Jeollabuk-do (KR); Seoung-Ki Lee, Jeollabuk-do (KR); Sang Hyun Lee, Jeollabuk-do (KR); Tae-Wook Kim, Jeollabuk-do (KR)

(73) Assignee: Korea Institute of Science and Technology, Seoul (KR)

( * ) Notice: Subject to any disclaimer, the term of this patent is extended or adjusted under 35 U.S.C. 154(b) by 117 days.

(21) Appl. No.: 16/032,585

(22) Filed: Jul. 11, 2018

(65) Prior Publication Data

US 2019/0024268 A1    Jan. 24, 2019

(30) Foreign Application Priority Data

Jul. 18, 2017  (KR) .................. 10-2017-0090902
Jun. 25, 2018  (KR) .................. 10-2018-0072707

(51) Int. Cl.
*G03F 7/20*    (2006.01)
*G03F 7/24*    (2006.01)
(Continued)

(52) U.S. Cl.
CPC .............. *G03F 7/2051* (2013.01); *B32B 5/00* (2013.01); *G03F 7/0035* (2013.01);
(Continued)

(58) Field of Classification Search
CPC ...................................... G03F 7/2002
See application file for complete search history.

(56) References Cited

U.S. PATENT DOCUMENTS

| | | | |
|---|---|---|---|
| 6,576,406 B1 * | 6/2003 | Jacobsen | G03F 7/24 |
| | | | 118/218 |
| 6,873,753 B2 | 3/2005 | Kaneko | |

(Continued)

FOREIGN PATENT DOCUMENTS

| | | | |
|---|---|---|---|
| JP | 5291277 B2 | 6/2013 | |
| JP | 5994077 B2 | 9/2016 | |

(Continued)

OTHER PUBLICATIONS

Hae Min Kim et al., "Metal-Insulator-Semiconductor Coaxial Microfibers Based on Self-Organization of Organic Semiconductor: Polymer Blend for Weavable, Fibriform Organic Field-Effect Transistors", Advanced Functional Materials, 2016, pp. 2706-2714, vol. 26.

*Primary Examiner* — Kathleen Duda
(74) *Attorney, Agent, or Firm* — Rabin & Berdo, P.C.

(57) ABSTRACT

A fiber-type electronic device comprising a pattern for electronic devices stacked on a fiber filament substrate is provided. It is possible to manufacture an electronic device directly on a fiber filament substrate by applying the pattern for electronic devices. Thus, it can be widely used for wearable devices and the like. The pattern for electronic devices is manufactured by a method for forming a pattern for electronic devices comprising an exposure process using a maskless exposure apparatus. Thus, it is possible to manufacture a pattern for electronic devices on a fiber filament substrate through a continuous process and thus to increase the process efficiency.

16 Claims, 30 Drawing Sheets

(51) Int. Cl.
  *G03F 7/00*    (2006.01)
  *B32B 5/00*    (2006.01)
  *H01L 21/027*  (2006.01)

(52) U.S. Cl.
  CPC .............. *G03F 7/2059* (2013.01); *G03F 7/24* (2013.01); *G03F 7/70791* (2013.01); *H01L 21/0272* (2013.01)

(56) References Cited

U.S. PATENT DOCUMENTS

| | | | |
|---|---|---|---|
| 7,842,880 B2 | 11/2010 | Gazda | |
| 2003/0064292 A1* | 4/2003 | Neudecker | ............ D02G 3/441 |
| | | | 429/235 |

FOREIGN PATENT DOCUMENTS

| | | | |
|---|---|---|---|
| KR | 10-2006-0134143 A | 12/2006 |
| KR | 10-2015-0128874 A | 11/2015 |
| KR | 10-1737828 B1 | 5/2017 |
| WO | WO 2005/096078 A1 | 10/2005 |
| WO | WO 2014-160498 A1 | 10/2014 |

* cited by examiner

4x8 32bit Memory cell array

4x16 64bit Memory cell array

METHOD FOR MANUFACTURING PATTERN FOR ELECTRONIC DEVICES, AND FIBER-TYPE ELECTRONIC DEVICE COMPRISING THE PATTERN FOR ELECTRONIC DEVICES

BACKGROUND OF THE INVENTION

Field of the Invention

The present invention relates to a method for manufacturing a pattern for electronic devices and a fiber-type electronic device comprising the pattern for electronic devices, particularly to a method for manufacturing a pattern for electronic devices that can contribute to scaling down and integration of electronic devices while contributing to ensuring high performance, high flexibility, and high reliability, and a fiber-type electronic device comprising the pattern for electronic devices.

Description of the Related Art

Recently, with an increasing interest in wearable computing systems, many functional fibers that can be utilized in the form of a textile product are being developed. For example, fibers in which a device such as a transistor and a resistor are integrated as well as fibers that perform specific functions, such as heating fibers, display fibers, and touch fibers, have been developed.

However, the fibers require a weaving method for making a fiber bundle into a fabric, and it is not easy to supply power to electronic fibers and connect electronic fibers with another device, while maintaining the flexibility and the like.

Conventionally, a fiber-type electronic device is manufactured by forming an electronic device on a substrate and then transferring the electronic device onto a fiber, as shown in FIG. 1A. Alternatively, at least two conductive fibers comprising an insulating layer and a semiconductor layer pattern sequentially stacked, a source electrode, and a drain electrode are formed, and the conductive fibers are placed at right angles to form one transistor, as shown in FIG. 1B. However, the cases of FIG. 1A and FIG. 1B require an extreme thickness to achieve the mechanical stability of the device, and also have problems with adhesion between the substrate and the clothes. In addition, the method for physically connecting conductive fibers with each other as shown in FIG. 1B has weak points in contact, durability, and the like, which poses a very difficult obstacle to the development of wearable devices using smart fibers.

Accordingly, there is an increasing demand for a new technology for manufacturing a pattern formed on a fiber substrate and which is excellent in performances such as contact and durability like conventional patterns while allowing scaling down and integration of electronic devices.

CITATION LIST

Patent Literature

Patent Literature 1: KR 10-2015-0128874

SUMMARY OF THE INVENTION

An object of the present invention is to provide a method for manufacturing a pattern for electronic devices that can contribute to scaling down and integration of electronic devices while contributing to ensuring high performance, high flexibility and high reliability, and the pattern for electronic devices.

Another object of the present invention is to provide a fiber-type electronic device comprising the pattern for electronic devices and which can be used in smart fibers.

In one embodiment, the present invention provides a fiber-type electronic device comprising: a fiber filament substrate; and a pattern for electronic devices formed on the fiber filament substrate.

In one exemplary embodiment, the fiber filament substrate may have a root mean square roughness of less than 50 nm.

In one exemplary embodiment, the fiber filament substrate may comprise at least one selected from the group consisting of a transparent glass fiber, an opaque glass fiber, a metal fiber, a transparent insulating polymeric fiber, a transparent conductive polymeric fiber, an opaque conductive polymeric fiber, an inorganic semiconductor fiber, an organic semiconductor fiber, and an oxide semiconductor fiber.

In one exemplary embodiment, the fiber filament substrate may have an aspect ratio of 100 or more.

In one exemplary embodiment, the pattern for electronic devices may comprise a pattern array for electronic devices comprising a plurality of patterns for electronic devices formed on a fiber filament substrate, the pattern array may be formed in plural numbers, and the patterns for electronic devices of each pattern array may have different areas from one another.

In one exemplary embodiment, the pattern for electronic devices may comprise a pattern array for electronic devices comprising a plurality of patterns for electronic devices, the pattern array may be formed in plural numbers, and the patterns for electronic devices of each pattern array may be arranged such that they have different shapes from one another.

In one exemplary embodiment, the pattern for electronic devices may be stacked in plural numbers on the fiber filament substrate.

In another embodiment, the present invention provides a transistor comprising: a fiber filament substrate; and a bottom electrode; a semiconductor layer pattern; a dielectric layer; and a top electrode sequentially formed on the fiber filament substrate.

In another embodiment, the present invention provides a transistor comprising: a fiber filament substrate and a transistor pattern array comprising a plurality of transistors formed on the fiber filament substrate, wherein the pattern array is formed in plural numbers, and the transistor comprises a bottom electrode, a semiconductor layer pattern, a dielectric layer, and a top electrode sequentially formed on the fiber filament substrate.

In one exemplary embodiment, the semiconductor layer pattern may be an n-type semiconductor layer pattern or a p-type semiconductor layer pattern.

In one exemplary embodiment, the bottom electrode may comprise a drain electrode and a source electrode, and the top electrode may comprise a gate electrode.

In one exemplary embodiment, the drain electrode and the source electrode may be spaced apart from each other, and the semiconductor layer pattern may comprise a channel portion connecting the drain electrode and the source electrode.

In another embodiment, the present invention provides an inverter comprising: a fiber filament substrate; and a bottom electrode; a p-type active layer; an n-type active layer; an insulating layer; and a top electrode sequentially formed on the fiber filament substrate.

In another embodiment, the present invention provides a ring oscillator comprising: a fiber filament substrate; and a bottom electrode; a p-type active layer; an n-type active layer; an insulating layer; a first contact hole; a top gate electrode; an interlayer insulating layer; a second contact hole; and a top electrode sequentially formed on the fiber filament substrate.

In another embodiment, the present invention provides a method for forming a pattern for electronic devices on a fiber filament substrate, the method comprising: forming a photoresist film on a fiber filament substrate; performing an exposure process, a photocuring process, and a development process on the photoresist film to form a photoresist pattern; performing a deposition process on the top surface of the photoresist pattern and the top surface of the fiber filament substrate on which the photoresist pattern is not formed to form a patterning layer for electronic devices; and removing the photoresist pattern and the patterning layer for electronic devices formed on the photoresist pattern from the fiber filament substrate to form a pattern for electronic devices, wherein the exposure process is performed using a maskless exposure apparatus.

In another embodiment, the present invention provides a method for forming a pattern for electronic devices on a fiber filament substrate, the method comprising: forming a patterning layer for electronic devices on a fiber filament substrate; forming a photoresist film on the patterning layer for electronic devices; performing an exposure process, a photocuring process, and a development process on the photoresist film to form a photoresist pattern; performing an etching process on the patterning layer for electronic devices using the photoresist pattern as a mask pattern to form a pattern for electronic devices; and removing the photoresist pattern, wherein the exposure process is performed using a maskless exposure apparatus.

In one exemplary embodiment, the fiber filament substrate may have a root mean square roughness of less than 50 nm.

In one exemplary embodiment, the fiber filament substrate may have an aspect ratio of 100 or more.

In one exemplary embodiment, the maskless exposure apparatus may comprise a maskless exposure unit for directly exposing the photoresist film using exposure data generated based on design data for the fiber filament substrate, and the design data may comprise pattern information for electronic devices predetermined for at least one conductive pattern to be formed on the fiber filament substrate and predetermined pad layout information of an electronic component to be mounted or formed on the pattern for electronic devices.

In one exemplary embodiment, the maskless exposure unit may comprise a scaling correction value generating unit for measuring the elongation and contraction of the photocured and developed fiber filament substrate relative to the fiber filament substrate before exposure and for generating a scaling correction value to correct the position and shape of the exposure data based on the measured elongation and contraction.

In one exemplary embodiment, the pattern for electronic devices may comprise a pattern array for electronic devices comprising a plurality of patterns for electronic devices, and the patterns for electronic devices of the pattern array may have different areas from one another.

In one exemplary embodiment, the pattern array for electronic devices is divided into a first region and a second region, and the patterns for electronic devices in the first region may have a smaller area than the patterns for electronic devices in the second region.

In one exemplary embodiment, the pattern for electronic devices comprises a pattern array for electronic devices comprising a plurality of patterns for electronic devices, and the patterns for electronic devices of the pattern array may be arranged such that they have different shapes from one another.

In one exemplary embodiment, the pattern for electronic devices may be formed to a thickness of 1 nm to 1 µm.

In one exemplary embodiment, the exposure process may be performed at a temperature of −20° C. to 100° C. and a pressure of $1 \times 10^{-8}$ torr to 1,500 torr.

In one exemplary embodiment, the fiber filament substrate may comprise at least one selected from the group consisting of a transparent glass fiber, an opaque glass fiber, a metal fiber, a transparent insulating polymeric fiber, a transparent conductive polymeric fiber, an opaque conductive polymeric fiber, an inorganic semiconductor fiber, an organic semiconductor fiber, and an oxide semiconductor fiber.

In one exemplary embodiment, the fiber filament substrate may have a cylindrical, trigonal prism, square pillar, or polyprism shape.

In one exemplary embodiment, the pattern for electronic devices may be at least one selected from the group consisting of a source electrode, a drain electrode, an insulating layer, a semiconductor layer pattern, and wiring of an electronic device.

In one exemplary embodiment, the pattern for electronic devices may be formed by a continuous process.

In another embodiment, the present invention provides a method for manufacturing a fiber-type electronic device comprising the method of forming a conductive pattern on a fiber filament substrate.

According to the method for manufacturing a pattern for electronic devices of the present invention, it is possible to form a pattern for electronic devices directly on the surface of a fiber filament substrate. That is, it is possible to form a pattern for electronic devices, such as metal wiring, an active layer such as a semiconductor layer pattern, a source electrode, a drain electrode, and an insulating layer, directly on the surface of a fiber filament substrate. In addition, it is possible to form an electronic device such as a transistor directly on a fiber filament substrate by applying it (that is, by performing a semiconductor process directly on a fiber filament substrate).

That is, according to the method for manufacturing a pattern for electronic devices of the present invention, it is possible to integrate devices directly on a monofilament substrate. Thus, it is possible to fundamentally solve the problem of poor contact between fibers while reducing the size of the unit device.

In addition, according to the method for manufacturing a pattern for electronic devices according to one embodiment of the present invention, it is possible to directly manufacture a pattern for electronic devices by a continuous process using a maskless exposure apparatus. This is distinguished from a batch process, which is used in conventional semiconductor processes. As a result, it also allows to secure the price competitiveness of electronic devices.

In addition, the electronic device manufactured according to the method for manufacturing a pattern for electronic devices is a fiber-type electronic device and can be used as a wearable electronic component. It can contribute to scaling down and integration of electronic devices while contributing to ensuring high performance, high flexibility and high reliability.

BRIEF DESCRIPTION OF THE DRAWINGS

FIG. 8B shows a method for forming a pattern for electronic devices using a positive photoresist pattern according to one embodiment of the present invention. The pattern for electronic devices may include all patterns constituting an electronic device, for example, metal wiring, a semiconductor layer pattern, an insulating layer, and the like;

FIG. 13A shows photographs of the surface in each step of the case of forming a positive photoresist pattern and using a lift-off process, and FIG. 13B shows photographs of the surface in each step of the case of using the process of etching a metal patterning layer;

DETAILED DESCRIPTION OF THE PREFERRED EMBODIMENTS

Figure 1A:
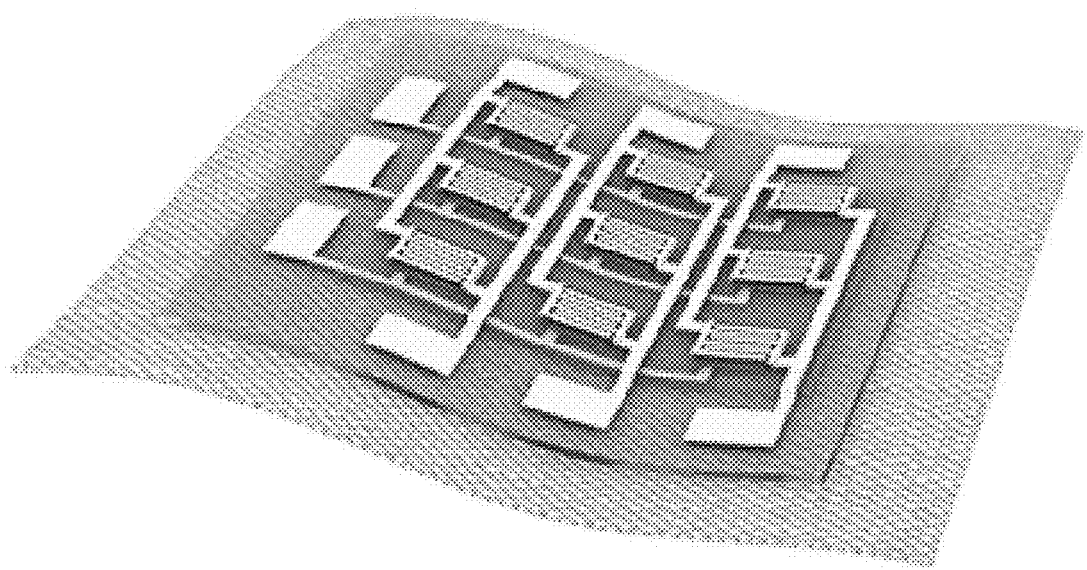
FIG. 1A and FIG. 1B are schematic diagrams showing the structures of fiber-type transistors according to the prior art.
Figure 1B:
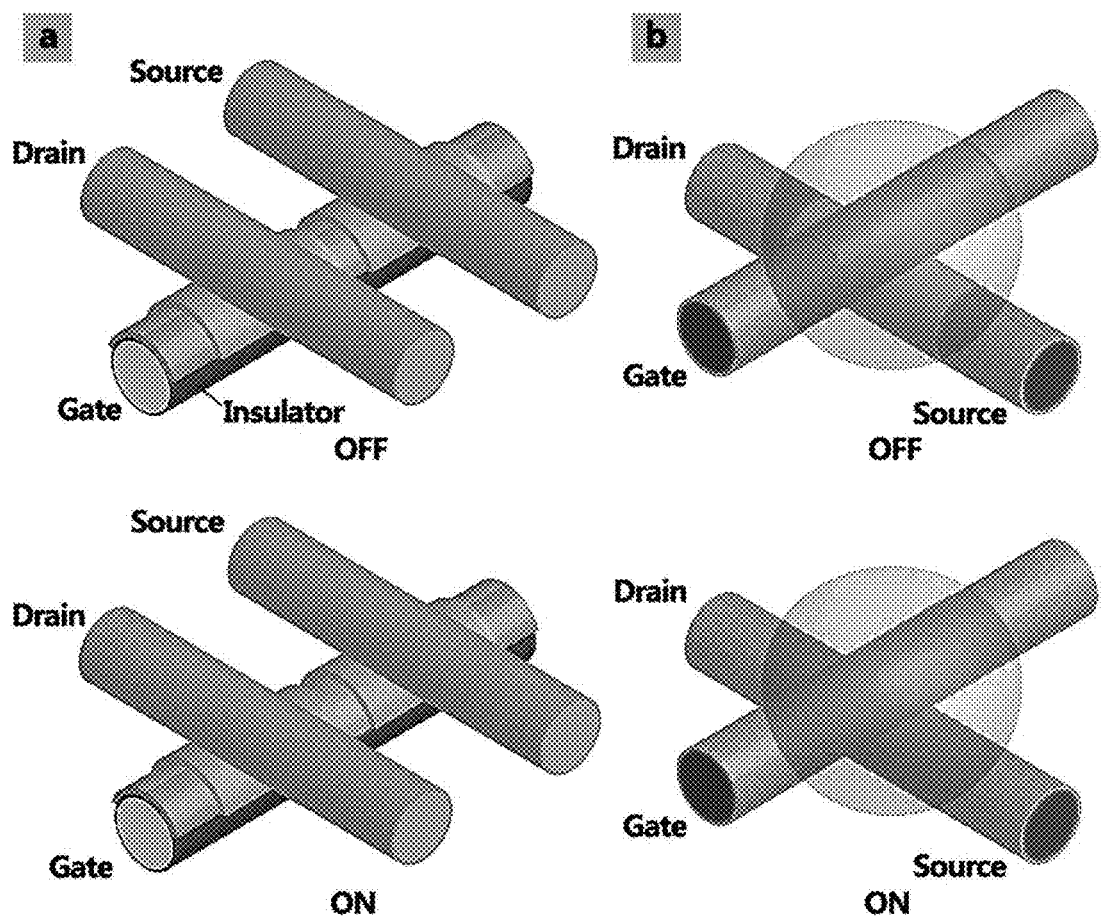
Figure 2:
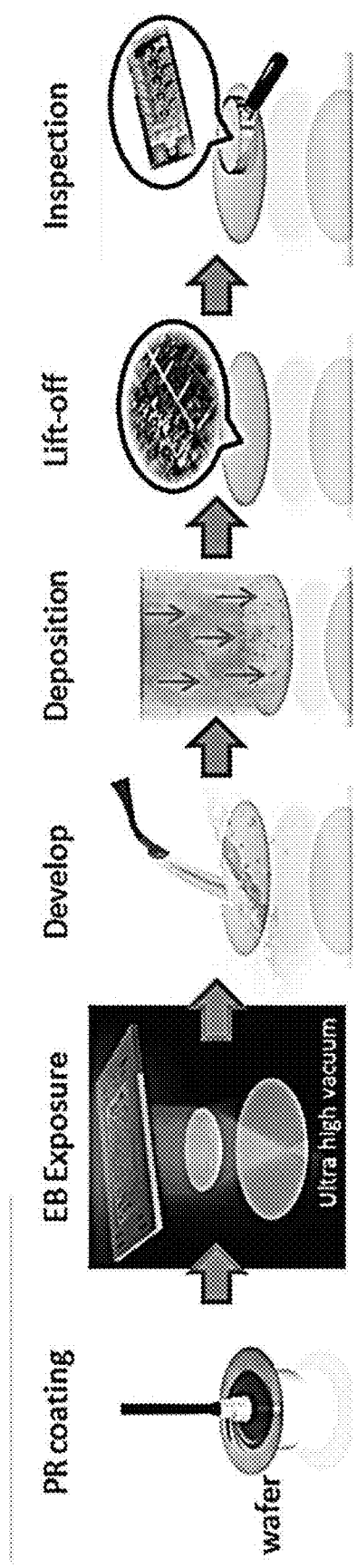
FIG. 2 is a schematic diagram showing the formation of a pattern for electronic devices according to the prior art.

Hereinafter, preferred embodiments of the present invention will be described in detail with reference to the accompanying drawings.

The sizes and relative sizes of the structures in the drawings are exaggerated for clarity.

It will be understood that, although the terms first, second and the like may be used herein to describe various elements, these elements should not be limited by these terms. These terms are only used to distinguish one element from another element.

The terminology used herein is for the purpose of describing particular embodiments only and is not intended to limit the scope of the present invention. As used herein, the singular forms "a," "an" and "the" are intended to include the plural forms as well, unless the context clearly indicates otherwise. It will be further understood that the terms "comprise," "include" and "have" as used herein specify the presence of stated features, numbers, steps, actions, elements, parts, or a combination thereof, but do not preclude the presence or addition of one or more other features, numbers, steps, actions, elements, parts, or a combination thereof.

It will be understood that when each layer, region, electrode, pattern, or structure is described as being formed "on" or "under" a subject, a substrate, or each layer, region, electrode or pattern, it may be formed directly on or located under the substrate, layer, region, or pattern, or another layer, region, electrode, pattern, or structure may be further formed on the subject or substrate.

Specific structural and functional descriptions of the embodiments of the present invention disclosed herein are set forth only for the purpose of describing the embodiments of the present invention. The present invention may be embodied in many different forms and should not be construed as limited to the embodiments set forth herein.

That is, while the present invention may be variously modified and embodied in many different forms, particular embodiments thereof are shown by way of example in the drawings and will herein be described in detail. It should be understood, however, that there is no intent to limit the present invention to the particular embodiments. On the contrary, the embodiments are to cover all modifications, equivalents, and alternatives falling within the scope of the invention.

Definition of Terms

In the embodiments of the present invention, the "pattern for electronic devices" is not limited as long as it is a pattern for electronic devices that can be formed on a substrate. For example, the pattern for electronic devices may comprise, without limitation, any material that can be used in electronic devices, for example, a metal such as copper and nickel, an insulating material such as silicon oxide, a semiconductor material such as GeSe, and the like. For example, if the pattern for electronic devices is a metal pattern comprising a metal, the pattern for electronic devices may be a bottom electrode, a top electrode, wiring, or the like of an electronic device. If the pattern for electronic devices comprises an insulating material, the pattern for electronic devices may be an insulating pattern of a fiber-type electronic device.

In the embodiments of the present invention, the term "aspect ratio" refers to the ratio of the length (L) to the diameter (d) of a fiber filament substrate.

In the embodiments of the present invention, the term "maskless exposure apparatus" refers to an exposure apparatus that exposes a pattern without a mask, unlike conventional analog exposure apparatuses, by manipulating light using software. The term "maskless exposure apparatus" may be used interchangeably with the terms "maskless aligner", "non-contact lithography apparatus", "laser lithography apparatus", "non-contact exposure apparatus" and the like, although not limited thereto.

In the embodiments of the present invention, the term "patterning layer for electronic device" refers to a layer for forming a source, a drain, an electrode, wiring, an insulating layer, and the like to be formed on a substrate and means a layer to be patterned. It is possible to manufacture a pattern for electronic devices by patterning the patterning layer for electronic devices according to a method for forming a pattern according to the present invention.

Fiber-Type Electronic Device

Figure 3:
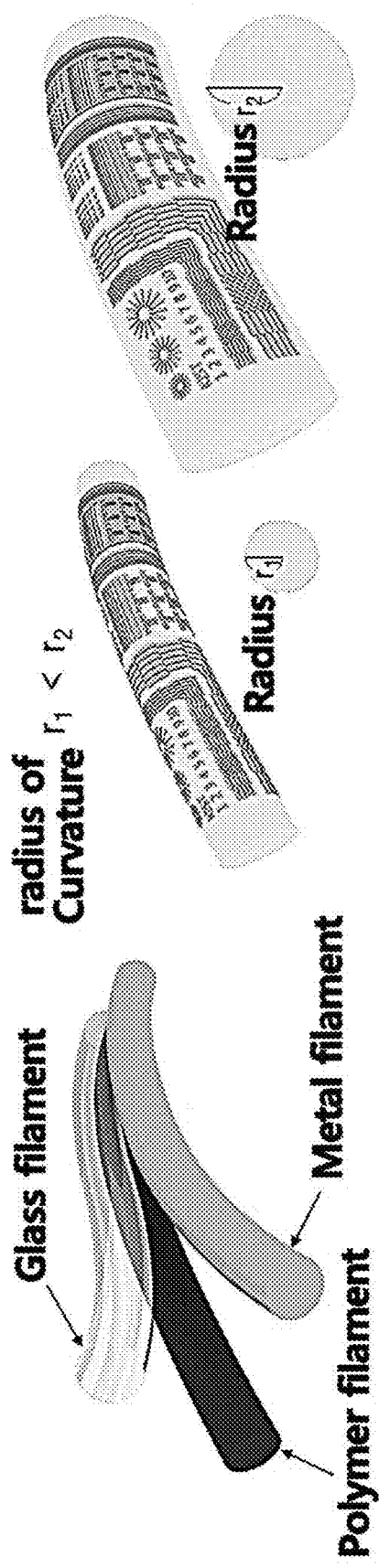
FIG. 3 is a mimetic diagram showing a pattern for electronic devices formed on a fiber filament substrate according to one embodiment of the present invention.

In one embodiment, the present invention provides a fiber-type electronic device comprising: a fiber filament substrate; and a pattern for electronic devices directly stacked on the fiber filament substrate (see FIG. 3).

Figure 4A:
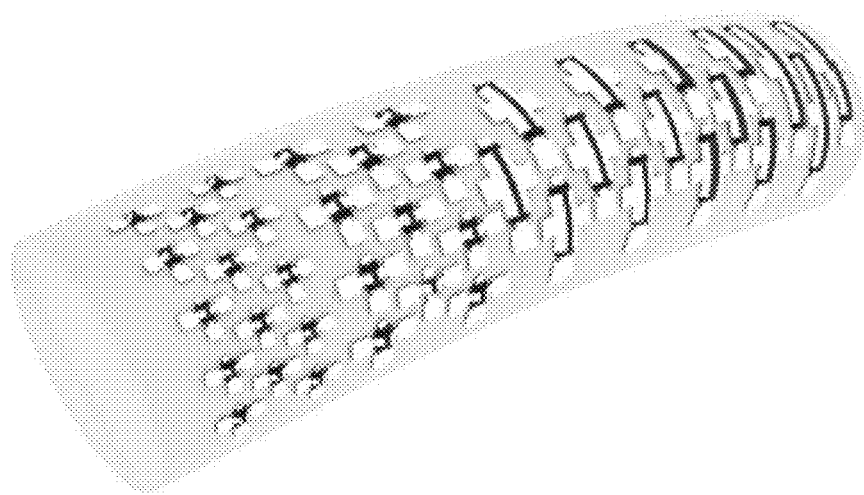
FIG. 4A is a mimetic diagram showing a fiber-type memory device according to one embodiment of the present invention.
Figure 4B:
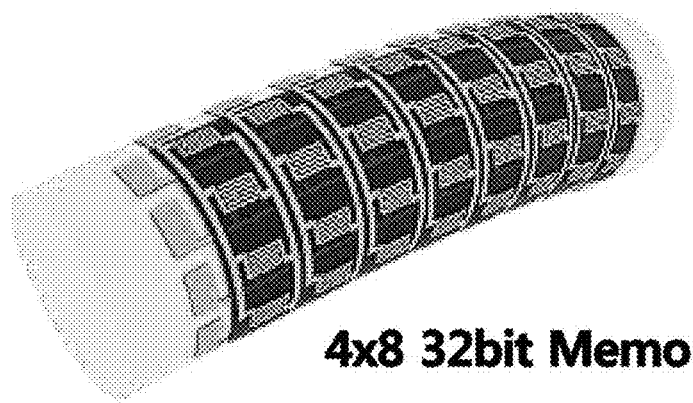
FIG. 4B is a mimetic diagram showing a fiber-type memory device comprising a plurality of memory cell arrays stacked on a fiber filament.
Figure 4B:
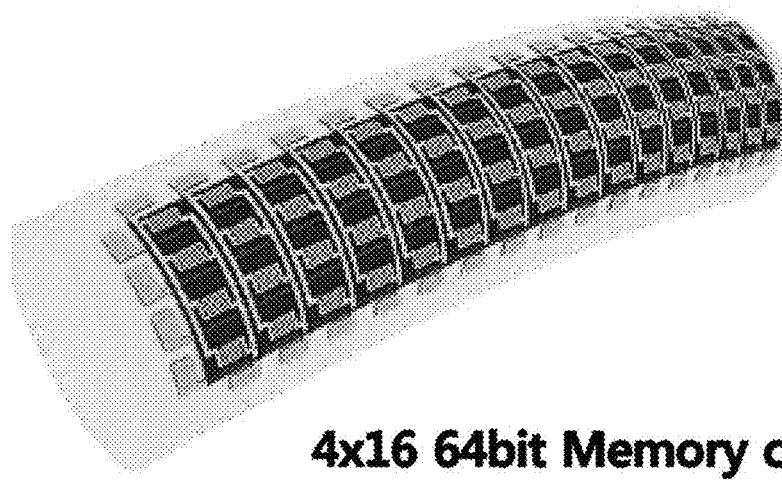
Figure 5A:
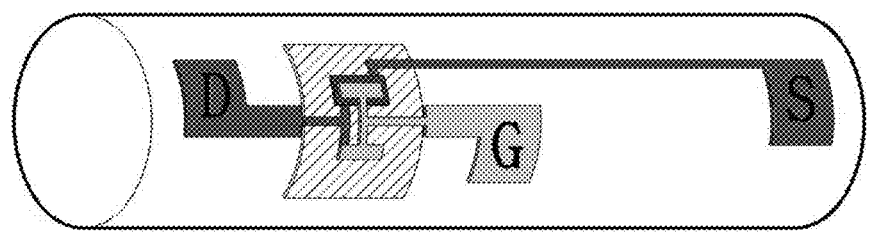
FIG. 5A to FIG. 5C respectively are mimetic diagrams showing the structures of a p-type transistor, an n-type transistor, and an inverter according to one embodiment of the present invention.
Figure 5B:
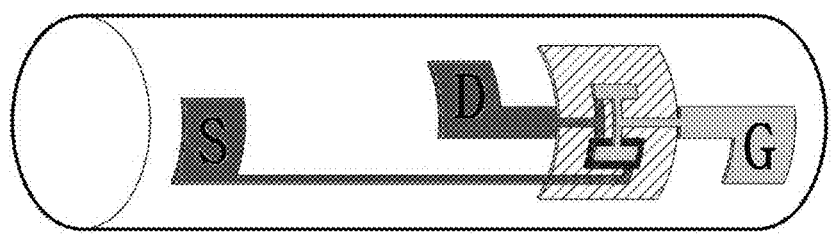
Figure 5C:
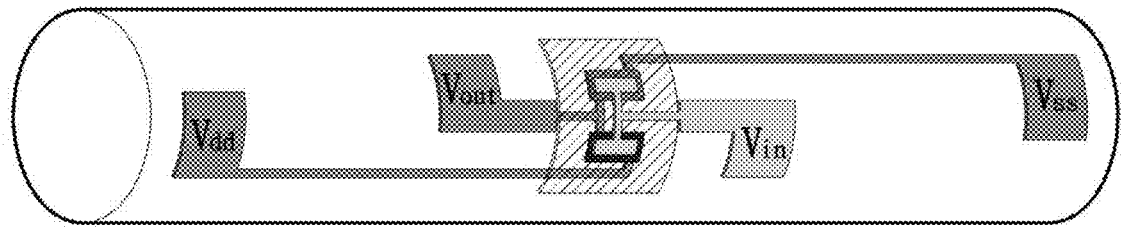
Figure 6:
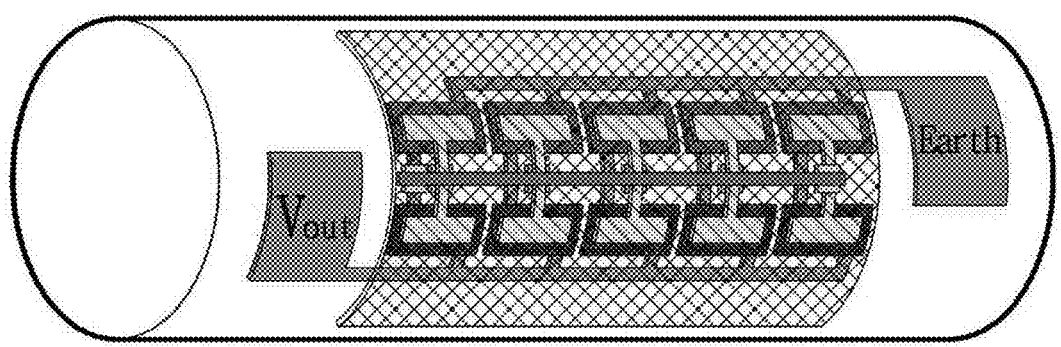
FIG. 6 is a mimetic diagram showing the structure of a ring oscillator according to one embodiment of the present invention.
Figure 7:
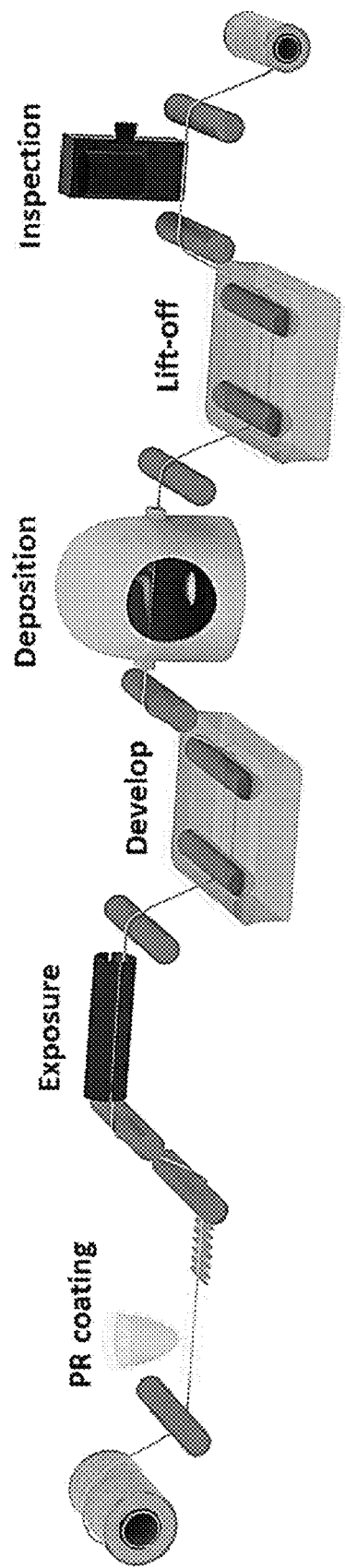
FIG. 7 is a schematic diagram showing a method for forming a pattern for electronic devices according to one embodiment of the present invention. According to this method, it is possible to form a pattern for electronic devices by a continuous process.

In another embodiment, the present invention provides a fiber-type electronic device comprising: a fiber filament substrate; and a plurality of patterns for electronic devices directly stacked on the fiber filament substrate (see FIG. 4A and FIG. 4B).

In one exemplary embodiment, the fiber filament substrate may comprise, without limitation, a transparent glass fiber, an opaque glass fiber, a metal fiber, a transparent insulating polymeric fiber, a transparent conductive polymeric fiber, an opaque conductive polymeric fiber, an inorganic semiconductor fiber, an organic semiconductor fiber, an oxide semiconductor fiber, and the like. For example, the fiber filament substrate may be a glass filament fiber used in the core of optical fibers.

In one embodiment, the fiber filament substrate may be a single strand of glass monofilament fiber.

In one embodiment, the fiber filament substrate may comprise a filler, and the filler may comprise silica particles and the like.

In the present invention, the surface roughness of the fiber filament substrate may be adjusted to form a pattern for electronic devices on a monofilament, which is a single strand of fiber. The fiber filament substrate may have a root mean square roughness of less than 50 nm. A pattern for electronic devices can be formed on the monofilament without a gap only when the fiber filament substrate has a root mean square roughness of less than 50 nm.

In one embodiment, the fiber filament substrate may have a root mean square roughness of 1 nm or less, for example, 0.1 nm or less.

In one exemplary embodiment, the fiber filament substrate may have an aspect ratio of 100 or more or 1000 or more, for example, 100 to 1000. The fiber filament substrate can be used as smart clothing only when it has an aspect ratio within the above range. The shape of the fiber filament substrate is not limited, but it may have a cylindrical, trigonal prism, square pillar, or polyprism shape.

In one embodiment, the fiber filament substrate may be a cylindrical fiber filament substrate having a radius of curvature of 1 to 2,500 μm. When the fiber filament substrate has a radius of curvature of less than 1 μm, it may be difficult to manufacture a pattern for electronic devices. When the fiber filament substrate has a radius of curvature exceeding 2,500 μm, it may be difficult to apply it to smart fibers and the like.

In one embodiment, the fiber filament substrate may have a radius of curvature of 10 to 200 μm.

In one exemplary embodiment, the pattern for electronic devices may be any element constituting an electronic device and which requires a pattern. For example, the pattern for electronic devices may be an electrode (for example, a source electrode, a drain electrode and the like), an insulating layer, a contact, wiring, or the like of electronic devices.

For example, when the pattern for electronic devices is used as an insulating pattern, the patterning layer may comprise an insulating material such as silicon oxide. When the pattern for electronic devices is used as a conductive pattern such as an electrode and wiring, it may comprise a conductive material such as a metal. When the pattern for electronic devices is used as a semiconductor pattern, it may comprise a material having semiconductor properties and the like.

In one exemplary embodiment, the pattern for electronic devices may have a thickness of 1 nm to 1 μm. For example, the pattern for electronic devices may have a thickness of 1 nm to 50 nm.

In one exemplary embodiment, the pattern for electronic devices may be formed horizontally in plural numbers on the fiber filament substrate.

In one exemplary embodiment, the pattern for electronic devices may comprise a plurality of pattern arrays for electronic devices comprising a plurality of patterns for electronic devices formed on a fiber filament substrate, and the pattern array may be formed in plural numbers. For example, FIG. 3 shows a pattern for electronic devices comprising various pattern arrays, and FIG. 15 shows a pattern for electronic devices comprising a total of 5 pattern arrays.

The patterns for electronic devices may have different widths from one another, as shown in FIG. 3. For example, when the pattern array for electronic devices is divided into a first region and a second region, the patterns for electronic devices in the first region may have a smaller area than the patterns for electronic devices in the second region.

In this case, for example, the patterns for electronic devices of the first region may have an area of 1 μm×1 μm to 7 μm×7 μm, and the patterns for electronic devices of the second region may have an area of 8 μm×8 μm to 30 μm×30 μm.

Figure 15:
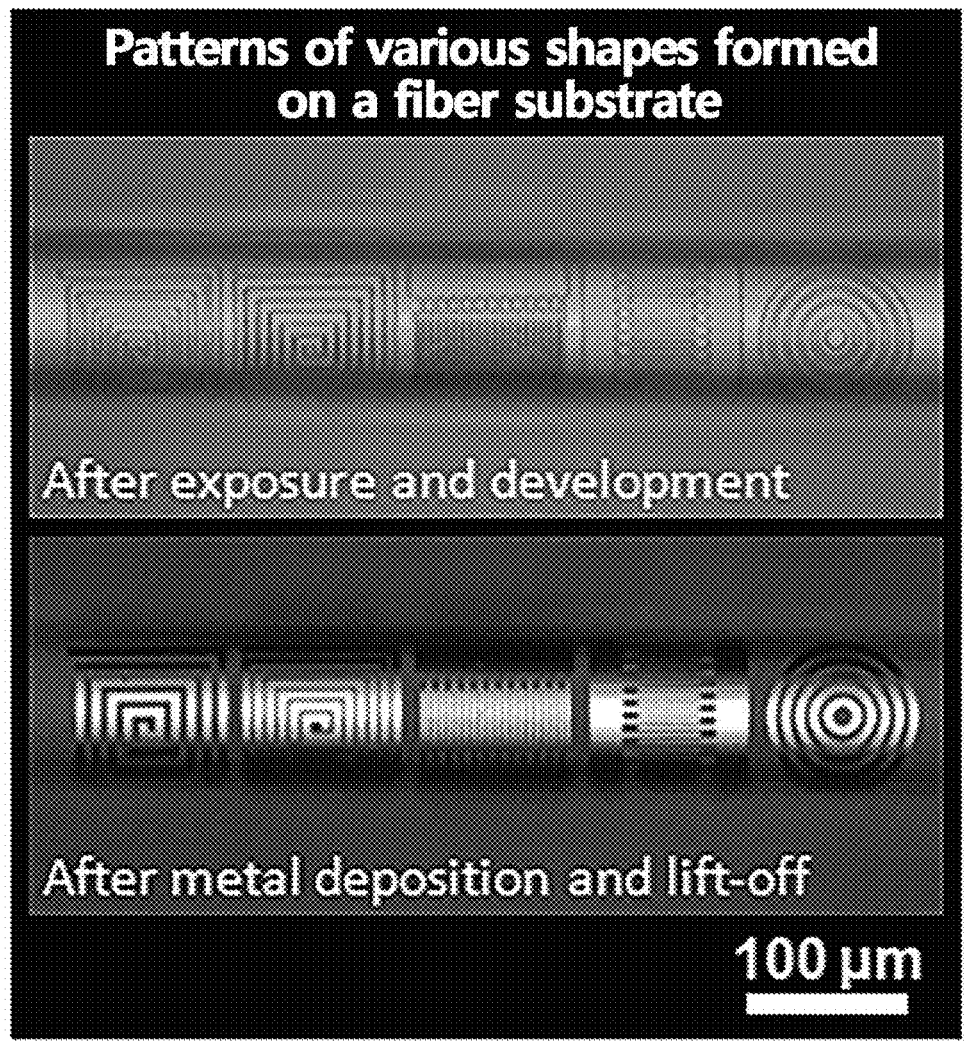
FIG. 15 shows photographs of patterns of various shapes formed on a fiber filament substrate according to one embodiment of the present invention.

The pattern array for electronic devices may be formed in plural numbers, and each pattern array may have different shapes from one another (see FIG. 15).

For example, when the pattern array for electronic devices is divided into a first region and a second region, the patterns for electronic devices of the first region may be arranged in a whirl shape so that the first region has a circular shape. When the patterns for electronic devices of the second region are arranged in a straight line, the second region may have a stripe shape.

As described above, the pattern for electronic devices of the present invention can be formed directly on a monofilament fiber and thus can be manufactured by a continuous process instead of a conventional batch process. In general, semiconductor processes are characterized by a batch process. In this case, unlike continuous processes, in which the process operation and production are uniform over time, the process operation and production are discontinuous due to the manufacture and recovery of semiconductors, which may cause disadvantages in terms of quality of the produced semiconductors or production time.

According to the present invention, a process for manufacturing a pattern for electronic devices can be performed regardless of the length of the fiber filament substrate. Thus, the fiber filament substrate may have a length of, for example, 1 cm to 1 km, although not limited thereto.

In one exemplary embodiment, the pattern for electronic devices may be vertically formed in plural numbers and stacked on one another. Thus, it is possible, by using the stacked pattern for electronic devices, to manufacture a fiber-type electronic device comprising: a fiber filament substrate; and a plurality of patterns for electronic devices formed on the fiber filament.

In one exemplary embodiment, the pattern for electronic devices in the electronic device may be cross-stacked.

For example, when the pattern for electronic devices comprises a metal layer and the pattern for electronic devices is cross-stacked, the plurality of patterns for electronic devices can function as an electrode, wiring, and the like formed on the monofilament.

It is possible, by applying the pattern for electronic devices of the present invention, to form a transistor, an inverter, a ring oscillator, and the like directly on a fiber filament substrate (see FIG. 5A to FIG. 5C and FIG. 6).

Thus, in another embodiment, the present invention provides a transistor comprising: a fiber filament substrate; and a bottom electrode; a semiconductor layer pattern; an insulating layer; and a top electrode directly and sequentially formed on the fiber filament substrate.

In particular, the transistor can be described with reference to FIG. 16 to FIG. 17B.

Figure 16:
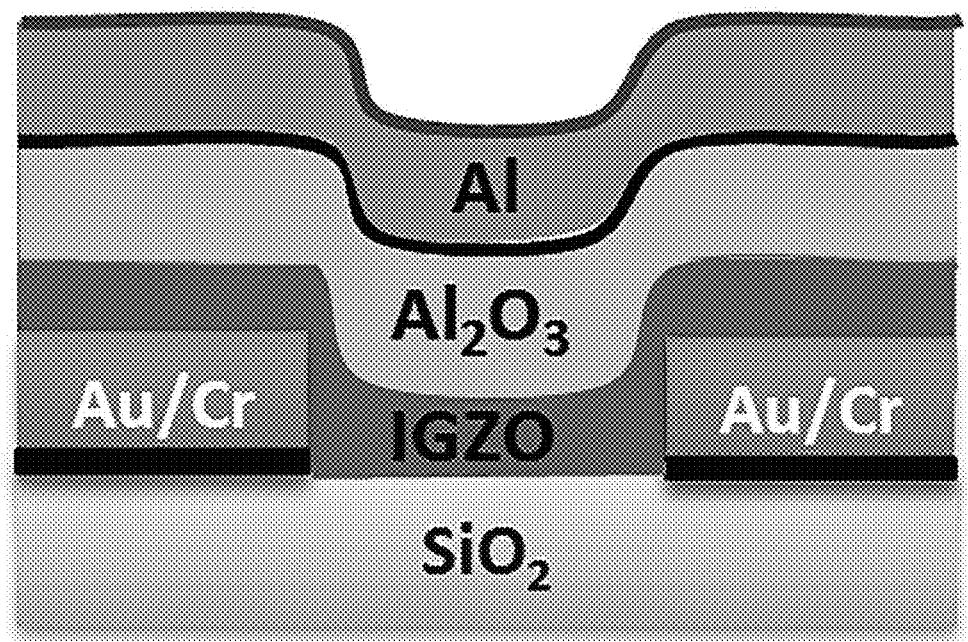
FIG. 16 shows a stacked structure of a transistor according to one embodiment of the present invention.
Figure 17A:
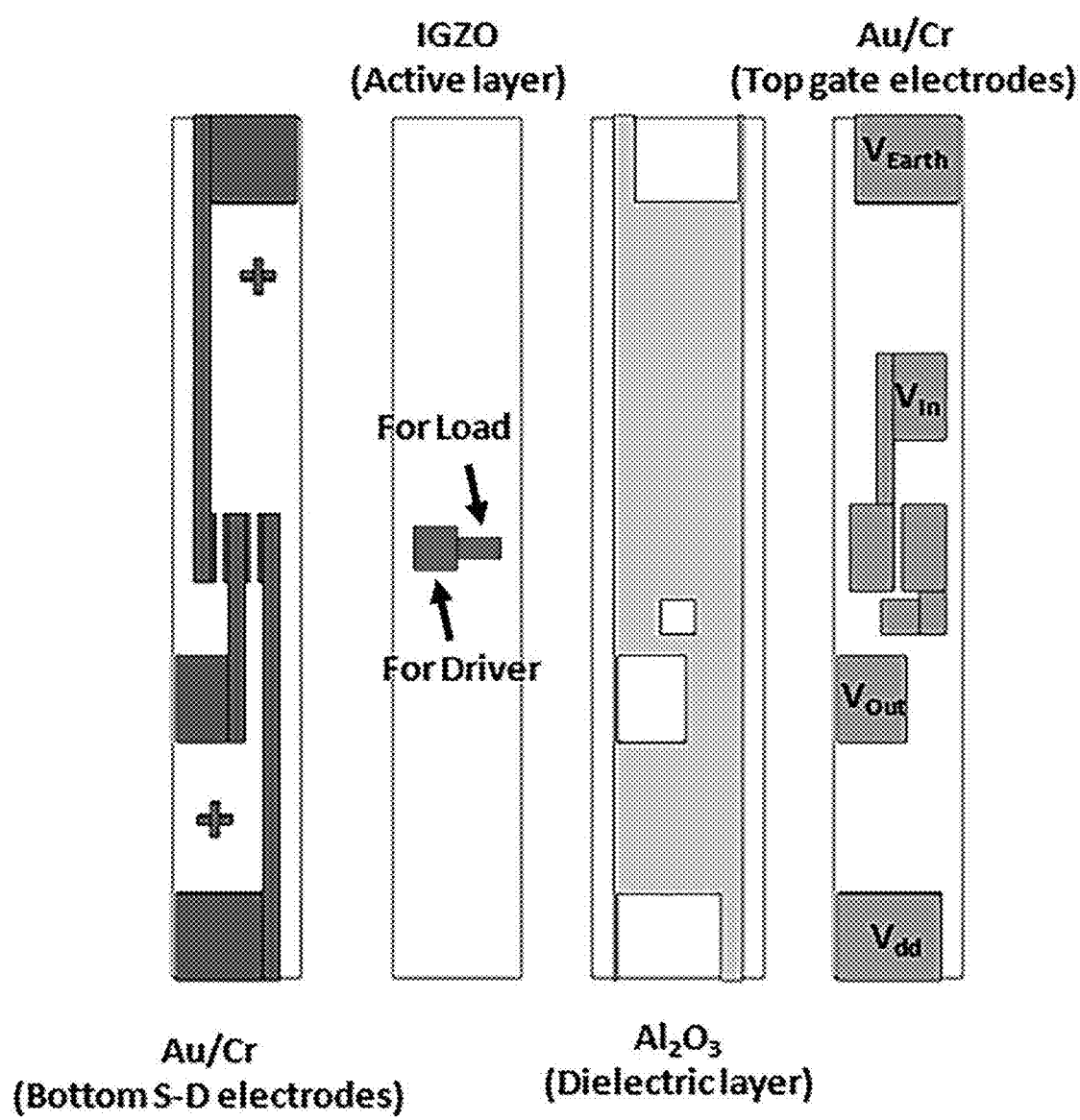
FIG. 17A is a top view of each layer of a transistor according to one embodiment of the invention.

FIG. 16 shows a stacked structure of a transistor according to one embodiment of the present invention, and FIG. 17A is a top view of each layer of a transistor according to one embodiment of the invention.

In one exemplary embodiment, the semiconductor layer pattern may be an n-type semiconductor layer pattern or a p-type semiconductor layer pattern.

In one exemplary embodiment, the bottom electrode may comprise a drain electrode and a source electrode, and the top electrode may comprise a gate electrode. For example, the bottom electrode may be made of at least one of a gold (Au) layer and a chromium (Cr) layer. Also, the top electrode may be made of aluminum (Al).

Optionally, the transistor may comprise an insulating layer formed between the bottom electrode and the fiber filament substrate. The insulating layer may be made of $SiO_2$, and the drain electrode and the source electrode can be insulated by the insulation.

In one exemplary embodiment, the drain electrode and the source electrode may be spaced apart from each other, and the semiconductor layer pattern may comprise a channel portion connecting the drain electrode and the source electrode. The channel portion may comprise a semiconductor layer pattern, and the semiconductor layer pattern may be made of a material of IGZO. In addition, the channel portion may have a channel length L and a channel width W, and the current characteristics of the transistor according to one embodiment of the present invention may vary depending on the ratio of the length and the width.

In one exemplary embodiment, the channel portion may have a length L and a width W, and the ratio (W/L) of the length and the width may range from 0.5 to 5. In one embodiment, the ratio of the length and the width may be about 0.8, 2.5, or 5.0. When the channel portion has a ratio (W/L) of the length and the width within the above range, the transistor according to one embodiment of the present invention can have excellent operation characteristics.

In one exemplary embodiment, the doping ratio of the semiconductor layer pattern may be 10 to 40% by weight based on the total weight of the semiconductor layer pattern. The doping ratio of the semiconductor layer pattern may be 20 to 40% by weight, 30 to 40% by weight, 10 to 30% by weight, or 10 to 20% by weight based on the total weight of the semiconductor layer pattern. When the doping ratio is within the above range, the transistor according to one embodiment of the present invention can have excellent operation characteristics.

In one exemplary embodiment, a dielectric layer may be formed on the semiconductor layer pattern. The dielectric layer may be made of $Al_2O_3$. It has dielectric properties and allows to increase the charge stored.

In one exemplary embodiment, a top electrode may be formed on the dielectric layer, and the top electrode may comprise a gate electrode. The gate electrode may be made of aluminum (Al).

Figure 17B:
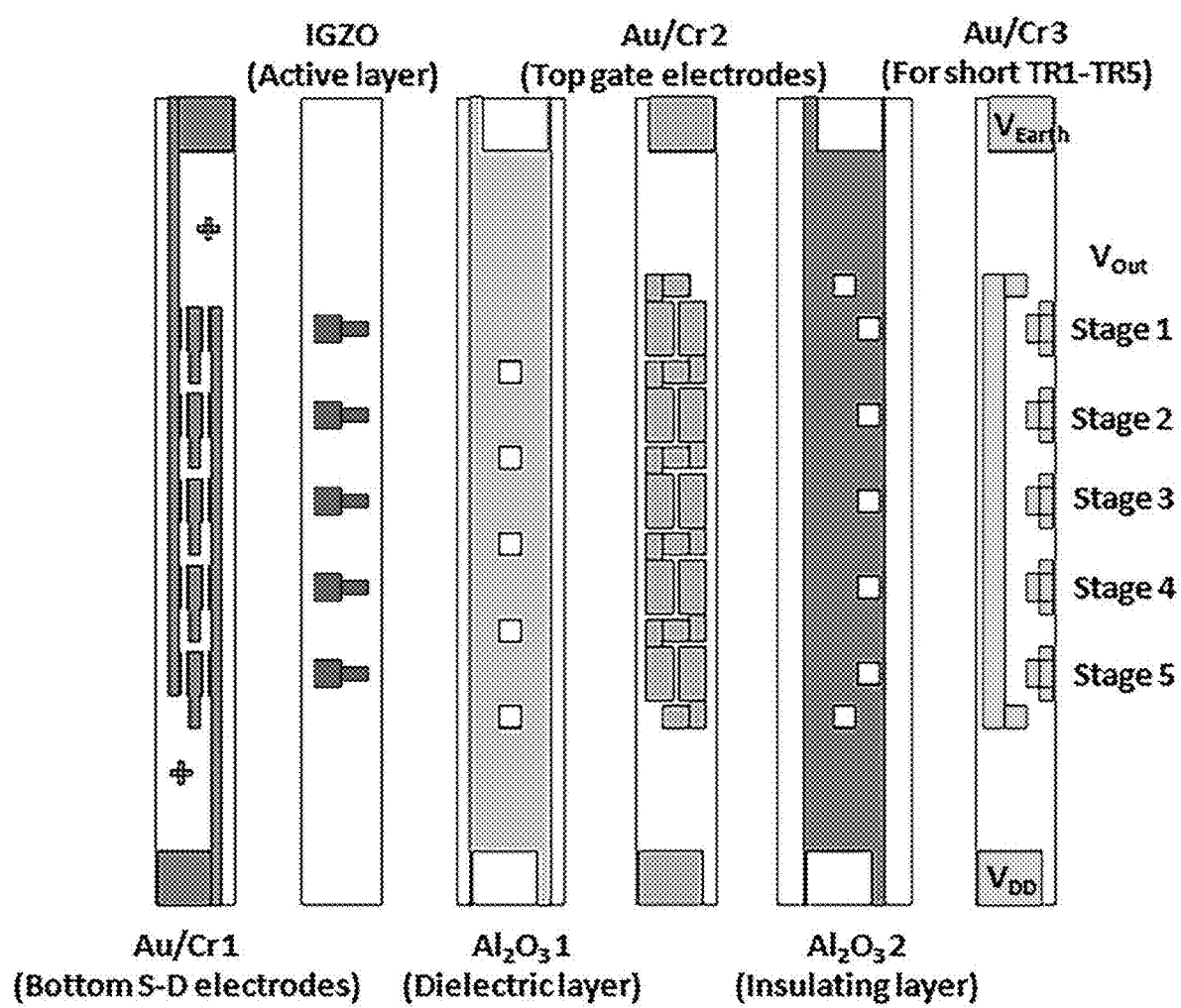
FIG. 17B shows a transistor according to one embodiment of the present invention, wherein the transistor comprises a transistor pattern array comprising a plurality of transistors formed on the fiber filament substrate.

FIG. 17B shows a transistor according to one embodiment of the present invention, wherein the transistor comprises a transistor pattern array comprising a plurality of transistors formed on the fiber filament substrate.

In one exemplary embodiment, the transistor may comprise a fiber filament substrate and a transistor pattern array comprising a plurality of transistors formed on the fiber filament substrate, wherein the pattern array may be formed in plural numbers, and the transistor may comprise a bottom electrode, a semiconductor layer pattern, a dielectric layer, and a top electrode sequentially formed on the fiber filament substrate.

In one exemplary embodiment, the bottom electrode of the plurality of transistors may comprise a plurality of drain electrodes and a plurality of source electrodes, the top electrode of the plurality of transistors may comprise a plurality of gate electrodes, and each electrode may correspond to each transistor.

Also, each of the drain electrode and the source electrode of the plurality of transistors may be spaced apart from each other, the semiconductor layer pattern may comprise a plurality of channel portions connecting the drain electrode and the source electrode, and each channel portion may be connected to each drain electrode and each source electrode.

In one exemplary embodiment, the plurality of transistors may further comprise an insulating layer and a short electrode layer formed on the top electrode.

In another embodiment, the present invention provides an inverter comprising: a fiber filament substrate; and a bottom electrode; a p-type active layer; an n-type active layer; an insulating layer; and a top electrode directly and sequentially formed on the fiber filament substrate.

In another embodiment, the present invention provides a ring oscillator comprising: a fiber filament substrate; and a bottom electrode; a p-type active layer; an n-type active layer; an insulating layer; a first contact hole; a top gate electrode; an interlayer insulating layer; a second contact hole; and a top electrode directly and sequentially formed on the fiber filament substrate.

The transistor, inverter, and ring oscillator can be manufactured by repeating the method for forming a pattern for electronic devices according to the present invention but using different target materials. Thus, it is possible to implement a transistor, an inverter, a ring oscillator and the like directly on a monofilament substrate. In addition, it is possible to implement more complicated circuits on a monofilament substrate by applying electronic devices and electronic circuits such as the transistor, inverter, and ring oscillator. Thus, it can not only contribute to scaling down and integration of electronic devices, but also solve electrical problems such as generation of leakage current, as compared to conventional fiber-type electronic devices. Thus, it can be widely used in the fields which require the use of fiber-type electronic devices, such as smart clothing.

They can be manufactured by performing a method for forming a pattern for electronic devices, which will be described later, multiple times. Hereinafter, first, a method for forming a pattern for electronic devices will be described in detail.

Method for Forming a Pattern for Electronic Devices

In one embodiment, the present invention provides a method for forming the above-described pattern for electronic devices. This method allows to continuously and directly form a pattern for electronic devices on the surface of a long fiber filament substrate using a maskless exposure apparatus. In particular, it enables to easily form a pattern for electronic devices on a fiber filament substrate having a curved surface, such as a cylindrical fiber filament substrate.

The method comprises: forming a photoresist film on a fiber filament substrate; performing an exposure process, a photocuring process, and a development process on the photoresist film to form a photoresist pattern; performing a deposition process on the top surface of the photoresist pattern and the top surface of the fiber filament substrate on which the photoresist pattern is not formed to form a patterning layer for electronic devices; and removing the photoresist pattern and the patterning layer for electronic devices formed on the photoresist pattern from the fiber filament substrate to form a pattern for electronic devices.

Figure 8A:
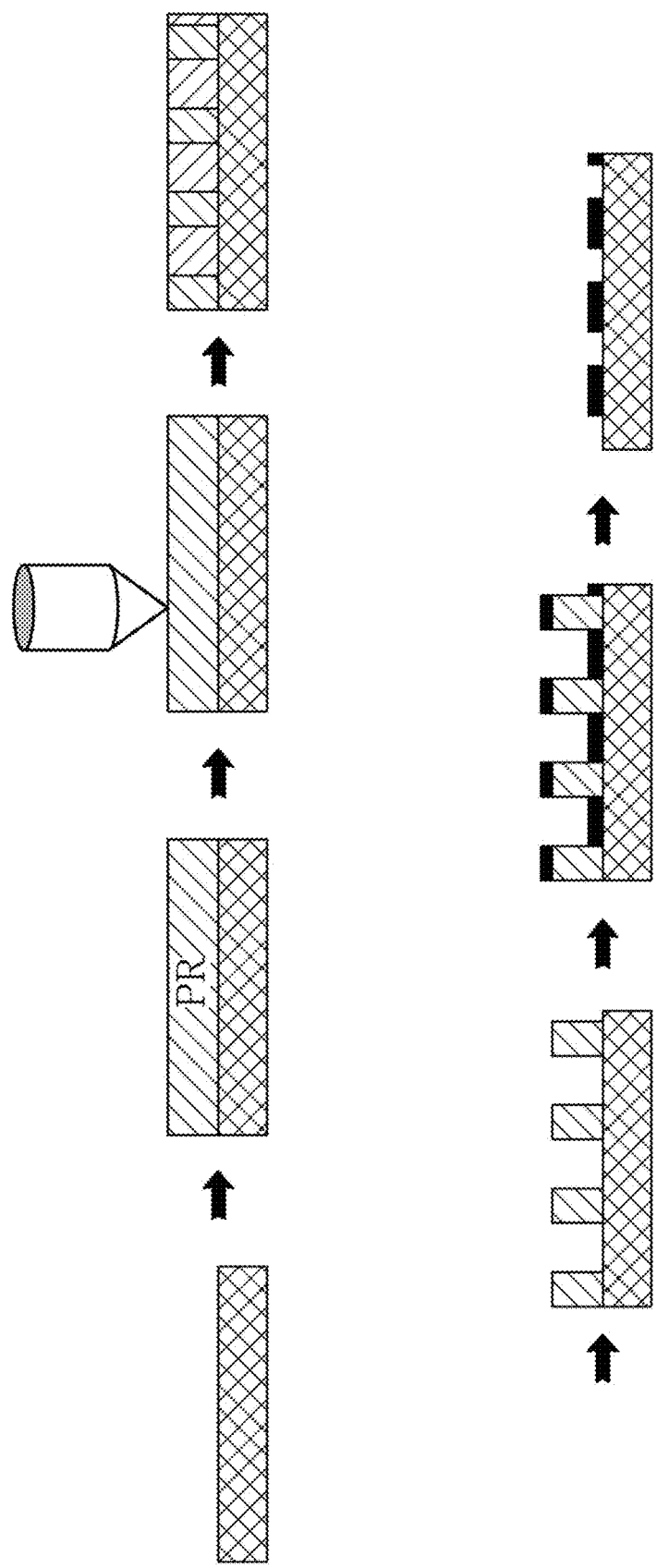
FIG. 8A shows a method for forming a pattern for electronic devices using a negative photoresist pattern according to one embodiment of the present invention.
Figure 8B:
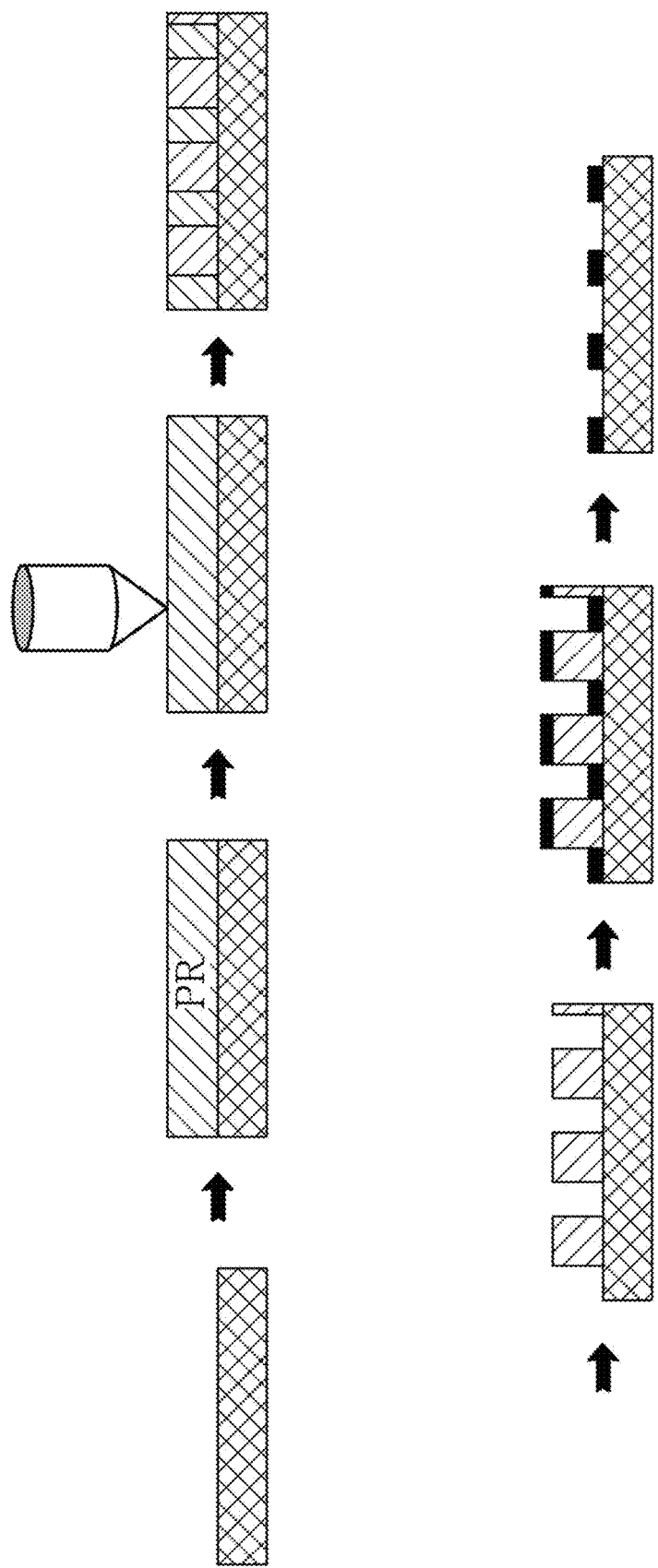

FIG. 8A and FIG. 8B are schematic diagrams showing a method for forming a pattern for electronic devices on a fiber filament substrate according to one embodiment of the present invention. Hereinafter, each step of the method will be described in detail based on FIG. 8A and FIG. 8B.

First, a photoresist film is formed on the fiber filament substrate (step (a)).

In one exemplary embodiment, the fiber filament substrate is not limited, but it may comprise a transparent glass fiber, an opaque glass fiber, a metal fiber, a transparent insulating polymeric fiber, a transparent conductive polymeric fiber, an opaque conductive polymeric fiber, an inorganic semiconductor fiber, an organic semiconductor fiber, an oxide semiconductor fiber and the like.

In one embodiment, the fiber filament substrate may be a glass filament fiber used in the core of optical fibers.

In one embodiment, the fiber filament substrate may comprise a filler, and the filler may comprise silica particles and the like.

In the present invention, it is necessary to adjust the surface roughness of the substrate since a semiconductor process has to be directly applied on the fiber filament substrate. For example, the fiber filament substrate may have a root mean square roughness of less than 50 nm, specifically a root mean square roughness of 1 nm or less. When the root mean square roughness of the fiber filament substrate exceeds 50 nm, it may decrease adhesion between the substrate and the pattern for electronic device, ultimately resulting in deterioration of the performance of the electronic device.

In one exemplary embodiment, the fiber filament substrate may have an aspect ratio of 100 or more or 1000 or more, for example, 100 to 1000. The shape of the fiber filament substrate is not limited, but it may have a cylindrical, trigonal prism, square pillar, or polyprism shape.

In one embodiment, the fiber filament substrate may be a cylindrical fiber filament substrate having a radius of curvature of 1 to 2,500 µm. When the fiber filament substrate has a radius of curvature of less than 1 µm, it may be difficult to manufacture a pattern for electronic devices. When the fiber filament substrate has a radius of curvature exceeding 2,500 µm, it may be difficult to apply it to smart fibers and the like.

In one embodiment, the fiber filament substrate may have a radius of curvature of 10 to 200 µm.

The process for manufacturing a pattern for electronic devices can be performed regardless of the length of the fiber filament substrate since the pattern for electronic devices of the present invention is manufactured by a continuous process. Thus, the manufacturing process may be performed on a long fiber filament substrate, and the fiber filament substrate can have a length of, for example, 1 km or less.

In one embodiment, the fiber filament substrate may have a length of 1 cm to 1 km.

In one exemplary embodiment, when forming the photoresist film, a positive photoresist film or a negative photoresist film may be formed. In the case of forming a negative photoresist film, a process as shown in FIG. 8A may be performed, and in the case of forming a positive photoresist film, a process as shown in FIG. 8B may be performed.

In one embodiment, when forming the photoresist film, a meniscus may be used. In addition, the coating speed may be controlled at 10 mm/min to 120 mm/min to control the thickness of the photoresist film.

Then, a polishing process for further reducing the surface roughness of the substrate and the like may be further performed before forming a photoresist film. In this case, the electrical performance of the electronic device comprising the corresponding pattern for electronic devices can be further improved.

Next, an exposure process, a photocuring process, and a development process are performed on the photoresist film to form a photoresist pattern (step (b)).

In the present invention, the exposure process is performed using a maskless exposure apparatus. Here, the maskless exposure apparatus comprises a maskless exposure unit for directly exposing the photoresist film to a light source using exposure data generated based on design data for the fiber filament substrate.

In one exemplary embodiment, the light source may be at least one selected from the group consisting of UV, X-ray, electron beam, IR, and microbeam.

It is important to form a photoresist pattern uniformly along the surface of the fiber filament substrate of the present invention since the fiber filament substrate may have a curved surface. Here, the design data is designed to comprise pattern information for electronic devices predetermined for at least one pattern for electronic devices to be formed on the fiber filament substrate and predetermined pad layout information of other patterns (for example, an electrode, an insulating layer, a semiconductor layer pattern and the like) to be mounted or formed on or under the pattern for electronic devices. Thus, it is possible to manufacture a photoresist pattern by performing a patterning process on the photoresist film without contacting the photoresist film with a mask.

The maskless exposure unit of the maskless exposure apparatus of the present invention comprises a scaling correction value generating unit for measuring the elongation and contraction of the photocured and developed fiber filament substrate relative to the fiber filament substrate before exposure and for generating a scaling correction value to correct the position and shape of the exposure data based on the measured elongation and contraction. Thus, even if the surface of the fiber filament substrate is curved, a photoresist pattern can be uniformly formed along the surface of the fiber filament substrate after photocuring and development processes, which will be described later, are performed.

In one exemplary embodiment, the exposure process may be performed at a temperature of $-20°$ C. to $100°$ C. and a pressure of $1 \times 10^{-8}$ torr to 1,500 torr. When the conditions are out of the above range, it may cause problems such as formation of a non-uniform pattern after exposure due to a change in the photoresist pattern and sticking of the photoresist pattern to the substrate.

Next, conventional photocuring and developing processes may be performed to form a photoresist pattern.

In one exemplary embodiment, the photoresist pattern may be a photoresist pattern array comprising a plurality of photoresist patterns. For example, the photoresist patterns may be spaced apart from one another by 1 µm×1 µm to 30 µm×30 µm.

In the exposure process, a drawing including a plurality of different patterns may be input to a program connected to the exposure apparatus to form a plurality of photoresist pattern arrays having different sizes and shapes from one another on the surface of the fiber filament substrate.

For example, in the exposure process, the fiber filament substrate may be divided into two different regions (a first region and a second region), and then a photoresist pattern array (a first pattern array) comprising a plurality of photoresist patterns spaced apart from one another by 1 µm×1 µm to 7 µm×7 µm may be formed on the first region of the fiber filament substrate, and a photoresist pattern array (a second pattern array) comprising a plurality of photoresist patterns spaced apart from one another by 8 µm×8 µm to 30 µm×30 µm may be formed on the second region.

In one embodiment, the photoresist pattern may have a width of 1 µm to 500 µm.

The division of the photoresist pattern into the first region and the second region is provided only by way of example. The photoresist pattern is not limited thereto and may be divided into a plurality of regions having various sizes.

Next, a patterning layer for electronic devices is formed on the top surface of the photoresist pattern and the top surface of the fiber filament substrate on which the photoresist pattern is not formed (step (c)).

Specifically, a patterning layer for electronic devices is formed on the top surface of the photoresist pattern and the top surface of the fiber filament substrate on which the photoresist pattern is not formed. As a result, only the top surface of the patterning layer for electronic devices can be observed when viewed from the top.

In one embodiment, the patterning layer for electronic devices is not limited as long as it is a layer that can be included in an electronic device formed on a substrate. For example, the patterning layer for electronic devices can function as a source, a drain, an insulating pattern, an electrode, and a semiconductor layer pattern after patterning.

In one embodiment, when a pattern for electronic devices formed by patterning the patterning layer is used as an insulating pattern, the patterning layer may comprise an insulating material such as silicon oxide. When the patterning layer is used as a conductive pattern such as an electrode and wiring, it may comprise a conductive material such as a metal.

In one embodiment, when a pattern for electronic devices to be described later is an electrode, wiring or the like, the patterning layer may comprise a metal such as copper and aluminum.

The patterning layer for electronic devices may be formed by a thermal evaporation process, an electron beam evaporation process, a sputtering process, a solution process, or the like.

Next, only the photoresist pattern, on which the patterning layer for electronic devices is formed, is removed from the fiber filament substrate to form a pattern for electronic devices on the fiber filament substrate (step (d)).

The photoresist pattern may be removed, for example, by an asking and/or stripping process.

At this time, the entire photoresist pattern formed on the fiber filament substrate is removed, and thus a part of the patterning layer for electronic devices, which is formed on the photoresist pattern, is removed. As a result, only the pattern for electronic devices spaced apart from one another at a certain interval finally remains on the substrate.

In one exemplary embodiment, the pattern for electronic devices may be a pattern array for electronic devices comprising a plurality of patterns for electronic devices. The patterns for electronic devices may have an area of 1 µm×1 µm to 30 µm×30 µm (that is, the patterns for electronic devices have an area corresponding to the spaced-apart region between the photoresist patterns in step (c)).

The pattern for electronic devices may have a plurality of pattern arrays for electronic devices having different sizes from one another. For example, when in step (c) described above, a photoresist pattern array (a first pattern array)

spaced apart from one another by 1 µm×1 µm to 7 µm×7 µm is formed on the first region of the fiber filament substrate and a photoresist pattern array (a second pattern array) spaced apart from one another by 8 µm×8 µm to 30 µm×30 µm is formed on the second region, the pattern array for electronic devices can be divided into a first region and a second region so that it corresponds to the photoresist pattern.

Thus, the patterns for electronic devices of the first region may have a smaller area than the patterns for electronic devices of the second region. In this case, the patterns for electronic devices of the first region may have an area of 1 µm×1 µm to 7 µm×7 µm, and the patterns for electronic devices of the second region may have an area of 8 µm×8 µm to 30 µm×30 µm.

Next, an additional process may be further performed depending on the nature of the pattern for electronic devices.

For example, when the pattern for electronic devices is a semiconductor active layer, a doping process such as an ion implantation process or a chemical process may be performed. Also, an annealing process and the like may be performed after the pattern for electronic devices is formed.

Further, a baking process and the like may be further performed to clean the surface.

In one exemplary embodiment, the pattern for electronic devices may be formed to a thickness of 1 nm to 1 µm. When the thickness is out of the above range, it may be difficult to achieve integration for use in electronic devices.

Also, in one embodiment, the pattern for electronic devices may be spaced apart from one another by a width of 0.2 µm to 500 µm.

As a result, it is possible to manufacture a pattern formed on a long fiber filament substrate. According to the method for forming a pattern on a fiber filament substrate of the present invention, it is possible to form a photoresist pattern on a photoresist film without a mask using only the design value. In this case, it is possible to form a pattern even on the curved surface of a fiber filament substrate. Since the pattern can also be used as an electrode, wiring or the like, the problem of contact of conventional technology can also be solved. That is, conventional electronic devices to which a fiber is applicable are classified into a substrate-integrated device and a fiber-woven device. They exhibit wrinkles, tearing, peeling, cracking, and poor contact when mechanical stress (bending/pulling) is applied. In contrast, the pattern according to the present invention does not cause the problems.

In addition, it is possible to design a transistor, a ring oscillator, an inverter or the like directly on a fiber filament substrate by performing the method for manufacturing a pattern formed on a fiber filament substrate of the present invention multiple times, but with appropriate application. Thus, the present invention contributes to scaling down and integration of electronic devices while contributing to ensuring high performance, high flexibility and high reliability of electronic devices. Also, it can be widely used for smart clothing and the like.

In addition, according to a method for forming a pattern on a fiber filament substrate according to one embodiment of the present invention, it is possible to apply a continuous process, which is distinguished from a batch process which is used in conventional semiconductor processes, allowing to obtain continuous mass production capability. Thus, it can increase the ease of process and enables to manufacture an electronic device with price competitiveness.

In another embodiment, the present invention provides a method for forming a pattern on a fiber filament substrate, comprising: forming a patterning layer for electronic devices on a fiber filament substrate; forming a photoresist film on the patterning layer for electronic devices; performing an exposure process, a photocuring process, and a development process on the photoresist film to form a photoresist pattern; performing an etching process on the patterning layer for electronic devices using the photoresist pattern as a mask pattern to form a pattern for electronic devices; and removing the photoresist pattern.

This manufacturing method is identical in basic configuration to the above-described method for forming a pattern on a fiber filament substrate, except that a photoresist pattern is formed after a patterning layer for electronic devices is formed and that an etching process is performed using the photoresist pattern as a mask pattern. Thus, the description of the same or similar configuration will be omitted.

Figure 13A:
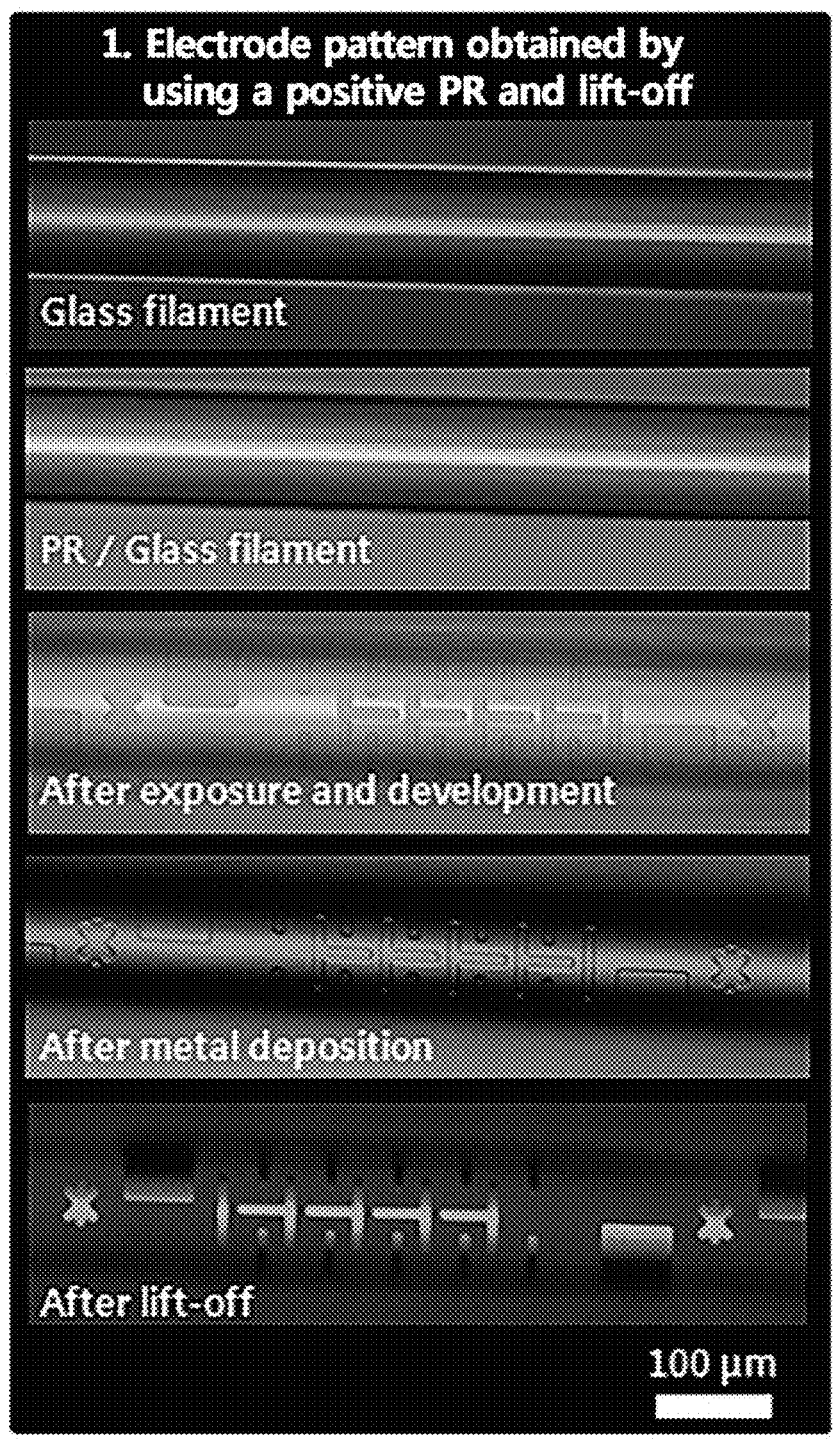
FIG. 13A and FIG. 13B are photographs showing the surface of a fiber filament substrate in each step of a method for forming a pattern for electronic devices on a fiber filament substrate according to one embodiment of the present invention.
Figure 13B:
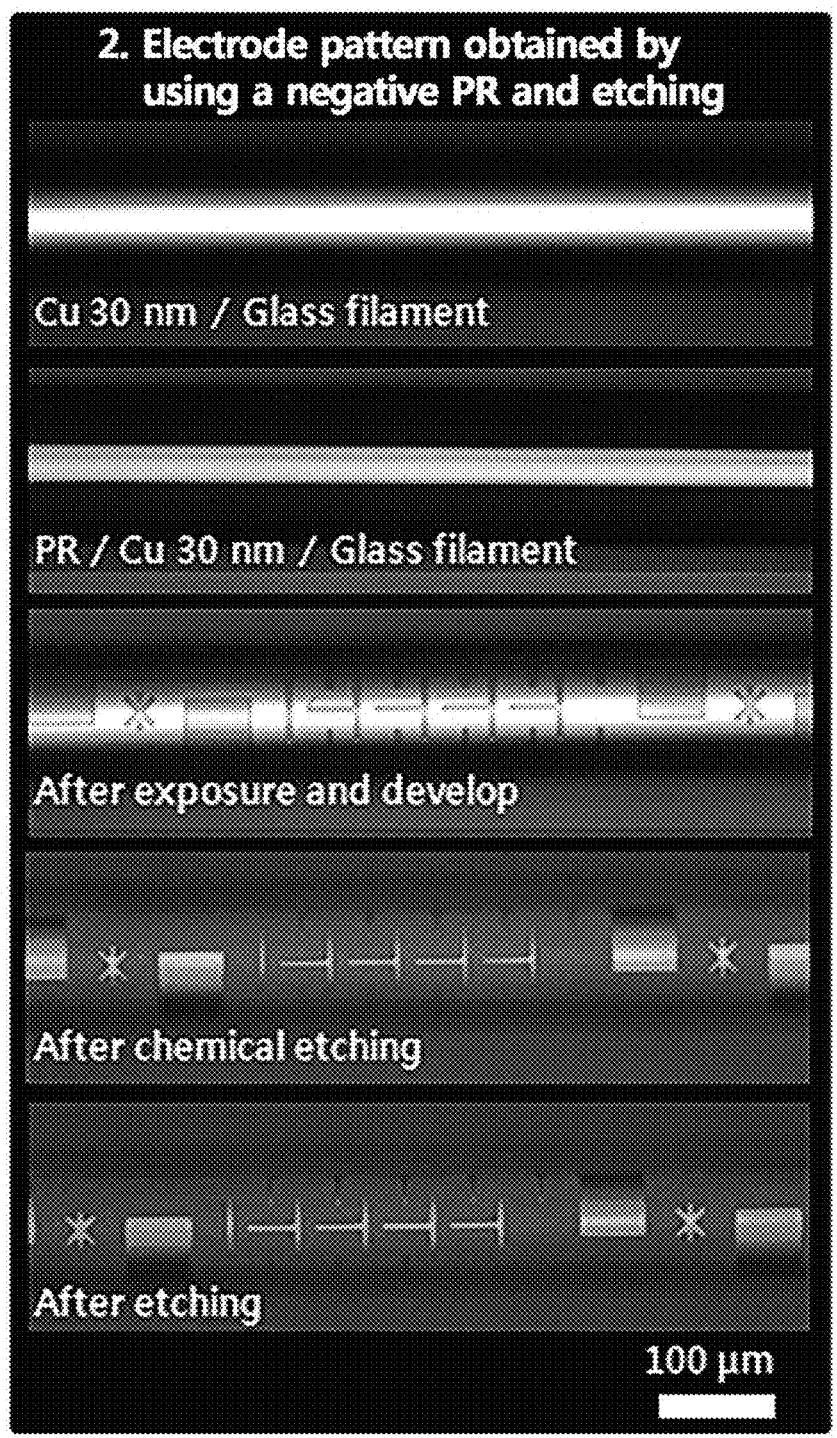

FIG. 13B are photographs showing the surface in each step of the method for forming a pattern for electronic devices on a fiber filament substrate. It shows the surface in each step of the case of using a process of etching a metal patterning layer on which a negative photoresist film is formed. Hereinafter, each step will be briefly described based on FIG. 13B.

First, a patterning layer for electronic devices is formed on a fiber filament substrate (step (A)).

In one exemplary embodiment, the fiber filament substrate is not limited, but it may comprise a transparent glass fiber, an opaque glass fiber, a metal fiber, a transparent insulating polymeric fiber, a transparent conductive polymeric fiber, an opaque conductive polymeric fiber, an inorganic semiconductor fiber, an organic semiconductor fiber, an oxide semiconductor fiber and the like.

In one exemplary embodiment, the fiber filament substrate may have a root mean square roughness of less than 50 nm. In one exemplary embodiment, the fiber filament substrate may have an aspect ratio of 100 or more or 1000 or more, for example, 100 to 1000. The fiber filament substrate is not limited, but it may have a cylindrical, trigonal prism, square pillar, or polyprism shape.

In one embodiment, the patterning layer for electronic devices is not limited as long as it is a layer that can be included in an electronic device formed on a substrate. For example, the patterning layer for electronic devices can function as a pattern for sources and drains, an insulating pattern, a pattern for electrodes, a semiconductor layer pattern and the like, after patterned.

In one embodiment, when a pattern for electronic devices formed by patterning the patterning layer is used as an insulating pattern, the patterning layer may comprise an insulating material such as silicon oxide. When the patterning layer is used as a conductive pattern such as an electrode and wiring, it may comprise a conductive material such as a metal.

In one embodiment, when a pattern for electronic devices to be described later is an electrode, wiring, or the like, the patterning layer may comprise a metal such as copper and aluminum.

The patterning layer for electronic devices may be formed by a deposition process, a sputtering process, a solution process, and the like.

Next, a photoresist film is formed on the patterning layer for electronic devices (step (B)).

When forming the photoresist film, a positive photoresist film or a negative photoresist film may be formed, and a polishing process for further reducing the surface roughness of the substrate and the like may be further performed before forming a photoresist film.

Next, an exposure process, a photocuring process, and a development process are performed on the photoresist film to form a photoresist pattern (step (C)).

In the present invention, the exposure process is performed using a maskless exposure apparatus. The fiber filament substrate may have a curved surface, and thus, it is important to uniformly form a photoresist pattern along the surface of the fiber filament substrate. When an exposure process is performed on a fiber filament substrate using a maskless exposure apparatus as in the present invention, it is possible to achieve a very dense design. Thus, it is possible, by applying the process, to manufacture an electronic device such as a transistor directly on a long fiber filament substrate, and in particular, it is possible to easily form a pattern for electronic devices on a fiber filament substrate having a curved surface, such as a cylindrical fiber filament substrate.

In one exemplary embodiment, the photoresist pattern may be a photoresist pattern array comprising a plurality of photoresist patterns. Each of the photoresist patterns may have an area of 1 µm×1 µm to 30 µm×30 µm.

In the exposure process, a drawing including a plurality of different patterns may be input to a program connected to the maskless exposure apparatus to form a plurality of photoresist pattern arrays having different sizes and shapes from one another on the surface of the fiber filament substrate.

Alternatively, in the exposure process, the fiber filament substrate may be divided into two different regions (a first region and a second region), and then photoresist pattern arrays of the first and second regions having different shapes from one another may be manufactured.

For example, in the exposure process, the fiber filament substrate may be divided into two different regions (a first region and a second region), and then a photoresist pattern array (a first photoresist pattern array) having an area of 1 µm×1 µm to 7 µm×7 µm may be formed on the first region of the fiber filament substrate, and a photoresist pattern array (a second photoresist pattern array) having an area of 8 µm×8 µm to 30 µm×30 µm may be formed on the second region.

Next, an etching process is performed directly on the patterning layer for electronic devices using the photoresist pattern as a mask pattern to form a pattern for electronic devices (step (D)).

That is, an etching process is performed on the patterning layer for electronic devices on which the photoresist pattern is not formed to form a pattern for electronic devices which is formed on the fiber filament substrate and which comprises patterns spaced apart from one another at regular intervals (In FIG. 14, the pattern is a metal film pattern).

The etching process is not limited to the above process and conventional etching processes may be used.

The patterns for electronic devices may be formed of a plurality of pattern arrays.

When, in step (C) described above, the first photoresist pattern array is formed on the first region and the second photoresist pattern array is formed on the second region, the pattern array for electronic devices can also be divided into a first region and a second region so that it corresponds to the photoresist pattern.

The patterns for electronic devices may each have an area of, for example, 1 µm×1 µm to 30 µm×30 µm. Also, the patterns for electronic devices may have a width of 1 µm to 500 µm.

In one embodiment, the patterns for electronic devices of the first region may have a smaller area than the patterns for electronic devices of the second region. In this case, the patterns for electronic devices of the first region may have an area of 1 µm×1 µm to 7 µm×7 µm and the patterns for electronic devices of the second region may have an area of 8 µm×8 µm to 30 µm×30 µm.

In one embodiment, the photoresist pattern may have a width of 1 µm to 500 µm. Next, the photoresist pattern remaining on the pattern for electronic devices is removed (step (E)).

Specifically, the photoresist pattern is removed from the pattern for electronic devices by, for example, an asking and/or stripping process.

As a result, only the pattern for electronic devices spaced apart from one another at certain intervals is finally formed on the fiber filament substrate.

As such, it possible to manufacture a pattern for electronic devices directly on a fiber filament substrate. For example, it is possible to manufacture a pattern for electronic devices along the curved surface of a fiber filament substrate. It is possible, by applying it, to solve the problem of contact of conventional fiber-type transistors. Thus, it is possible to manufacture an integrated electronic device having high performance, high flexibility, and high reliability on a fiber filament substrate. Various electronic devices can be manufactured by applying the present invention. However, by way of example, a method for manufacturing transistors, inverters, and ring oscillators will be described below with reference to FIG. 9 to FIG. 12.

Method for Manufacturing Transistors, Inverters, and Ring Oscillators

Hereinafter, manufacturing a p-type transistor, an n-type transistor, an inverter, and an oscillator on a cylindrical monofilament substrate will be described based on FIG. 9 to FIG. 12. However, the present invention is not limited thereto.

Figure 9:
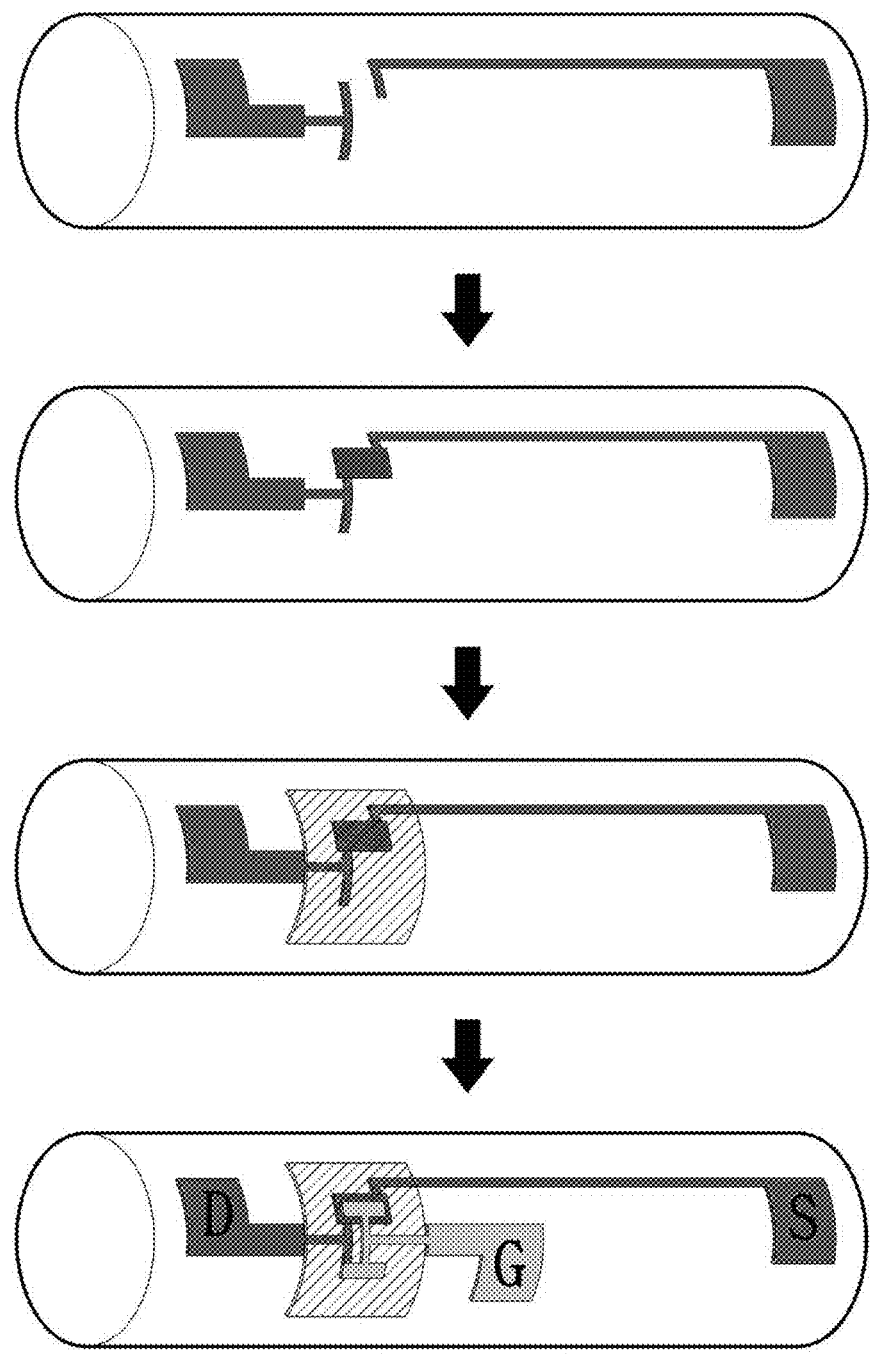
FIG. 9 is a conceptual diagram showing a method for manufacturing a p-type transistor according to one embodiment of the present invention.
Figure 10:
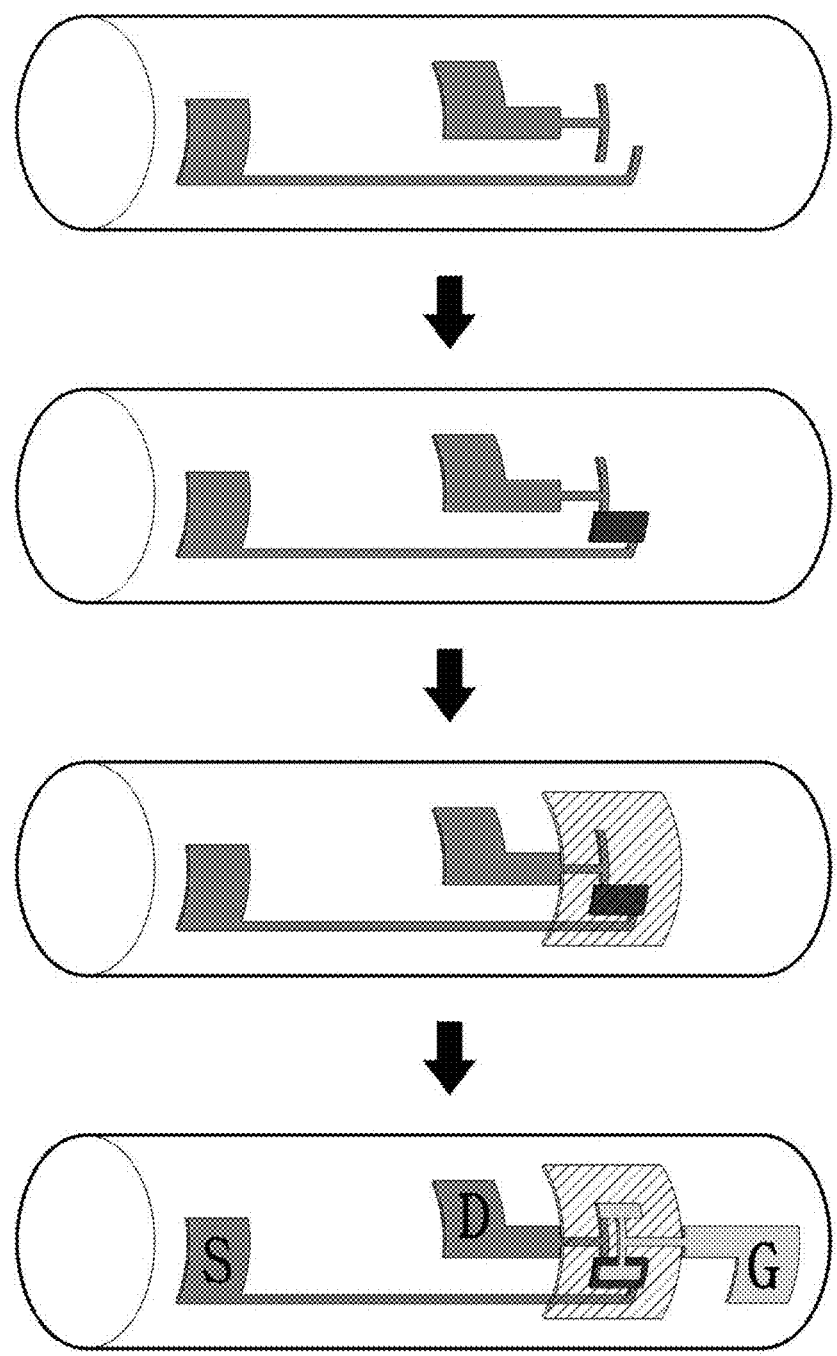
FIG. 10 is a conceptual diagram showing a method for manufacturing an n-type transistor according to one embodiment of the present invention.
Figure 11:
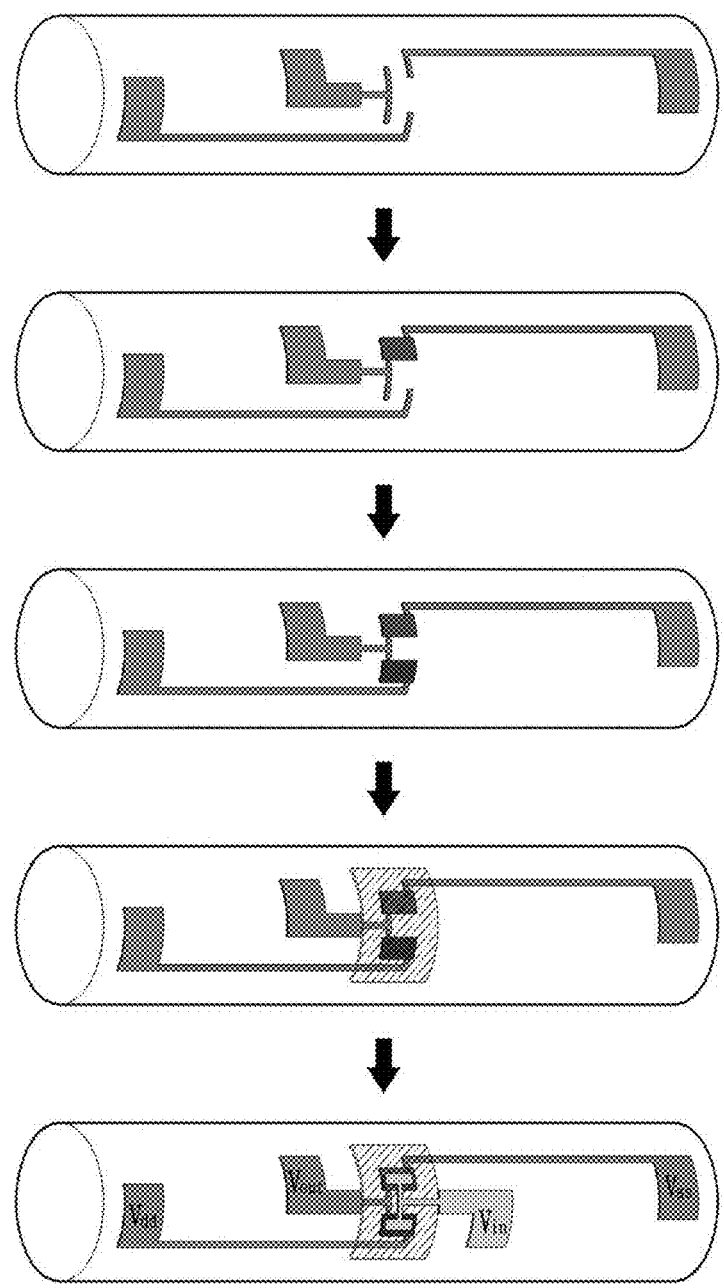
FIG. 11 is a conceptual diagram showing a method for manufacturing an inverter according to one embodiment of the present invention.
Figure 12:
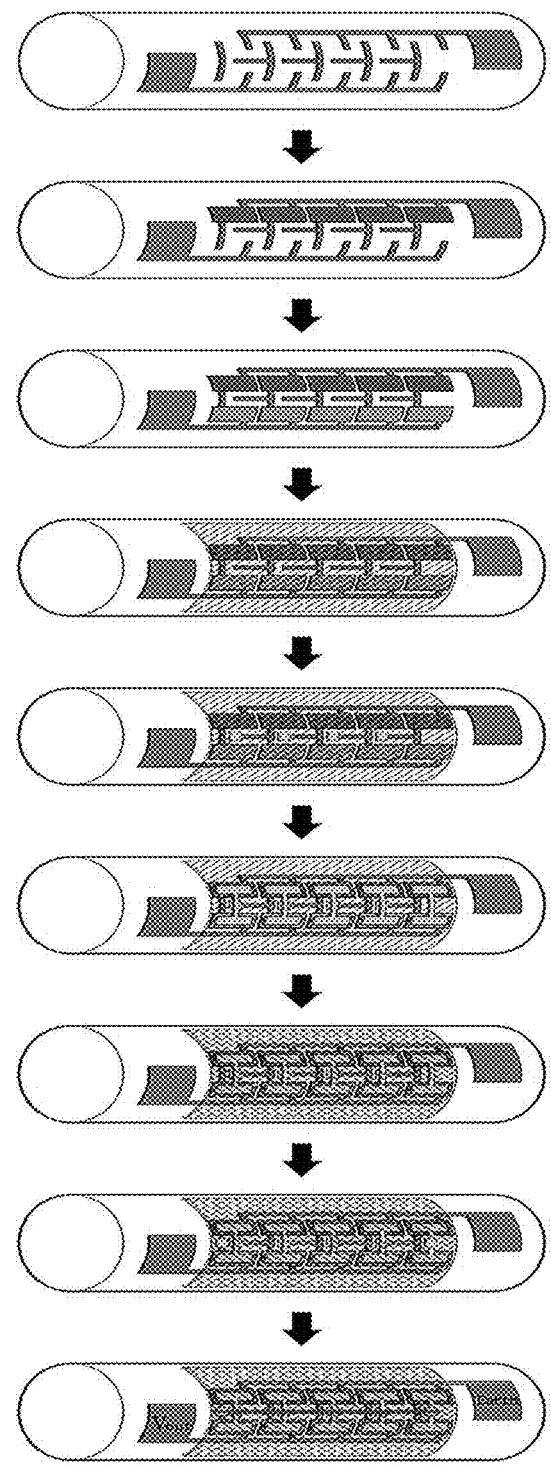
FIG. 12 is a conceptual diagram showing a method for manufacturing a ring oscillator according to one embodiment of the present invention.

First, a method for manufacturing p-type transistors by applying a method for forming a pattern for electronic devices according to one embodiment of the present invention will be described (see FIG. 9).

First, a metal film pattern is formed directly on a fiber filament substrate by the above-described method for forming a pattern for electronic devices on a fiber filament substrate, to form a bottom electrode. Then, a p-type semiconductor layer pattern is formed on the fiber filament substrate on which the bottom electrode is formed, by the method for forming a pattern for electronic devices. Here, the p-type semiconductor layer pattern may comprise a semiconductor active material. Then, an insulating layer is formed on the fiber filament substrate on which the bottom electrode and the p-type semiconductor layer pattern are sequentially formed, by the method for forming a pattern for electronic devices of the present invention. The insulating layer may be silicon oxide or the like. Then, a metal film pattern is formed again directly on the fiber filament substrate on which the bottom electrode, the p-type semiconductor layer pattern and the insulating layer are sequentially stacked, by the method for forming a pattern for electronic devices, to form a top electrode.

Through this process, a p-type transistor having a structure of a bottom electrode/p-type semiconductor layer pattern/insulating layer/top electrode can be formed directly on a fiber filament substrate.

The method for manufacturing n-type transistors is as follows (see FIG. 10):

A metal film pattern is formed directly on a fiber filament substrate by the above-described method for forming a pattern for electronic devices on a fiber filament substrate, to form a bottom electrode. Then, an n-type semiconductor layer pattern comprising an n-type semiconductor material is formed on the fiber filament substrate on which the bottom electrode is formed, by the method for forming a pattern for electronic devices. Then, an insulating layer is formed on the fiber filament substrate on which the bottom electrode and the n-type semiconductor layer pattern are sequentially formed, by the method for forming a pattern for electronic devices. Here, the insulating layer may be silicon oxide or the like. Then, a metal film pattern is formed directly on the fiber filament substrate on which the bottom electrode, the n-type semiconductor layer pattern and the insulating layer are sequentially stacked, by the method for forming a pattern for electronic devices, to form a top electrode.

Through this process, a n-type transistor having a structure of a bottom electrode/n-type semiconductor layer pattern/insulating layer/top electrode can be formed directly on a fiber filament substrate.

The method for manufacturing inverters is as follows (see FIG. 11):

A metal film pattern is formed directly on a fiber filament substrate by the above-described method for forming a pattern for electronic devices on a fiber filament substrate, to form a bottom electrode. Then, a p-type semiconductor layer pattern doped with an active material is formed on the fiber filament substrate on which the bottom electrode is formed, by the method for forming a pattern for electronic devices. Then, an n-type semiconductor layer pattern is formed on the fiber filament substrate on which the bottom electrode and the p-type semiconductor layer pattern are sequentially formed, by the method for forming a pattern for electronic devices. Then, an insulating layer is formed on the fiber filament substrate on which the bottom electrode and the p-type semiconductor layer pattern and the n-type semiconductor layer pattern are sequentially formed, by the method for forming a pattern for electronic devices. Then, a metal film pattern is formed directly on the fiber filament substrate on which the bottom electrode, the p-type semiconductor layer pattern, the n-type semiconductor layer pattern and the insulating layer are sequentially formed, by the method for forming a pattern for electronic devices, to form a top electrode.

Through this process, an inverter having a structure of a bottom electrode/p-type semiconductor layer pattern/n-type semiconductor layer pattern/insulating layer/top electrode can be formed directly on a fiber filament substrate.

The method for manufacturing ring oscillators is as follows (see FIG. 12):

A metal film pattern is formed directly on a fiber filament substrate by the above-described method for forming a pattern for electronic devices on a fiber filament substrate, to form a bottom electrode. Then, a p-type semiconductor layer pattern is formed on the fiber filament substrate on which the bottom electrode is formed, by the method for forming a pattern for electronic devices. Then, an n-type semiconductor layer pattern is formed on the fiber filament substrate on which the bottom electrode and the p-type semiconductor layer pattern are sequentially formed, by the method for forming a pattern for electronic devices. Then, an insulating layer is formed on the fiber filament substrate on which the bottom electrode, the p-type semiconductor layer pattern and the n-type semiconductor layer pattern are sequentially formed, by the method for forming a pattern for electronic devices. Then, a metal film pattern is formed directly on the fiber filament substrate on which the bottom electrode, the p-type semiconductor layer pattern, the n-type semiconductor layer pattern and the insulating layer are sequentially formed, by the method for forming a pattern for electronic devices, to form first contact holes. Then, a metal film pattern is formed directly on the fiber filament substrate on which the bottom electrode, the p-type semiconductor layer pattern, the n-type semiconductor layer pattern, the insulating layer and the first contact holes are sequentially formed, to form a top gate electrode. Then, an interlayer insulating layer is formed by the method for forming a pattern for electronic devices. Then, a metal film pattern is formed by the same method to form a second contact hole. Then, a top electrode is formed by the method for forming a pattern for electronic devices of the present invention.

As a result, a ring oscillator is manufactured which is formed on a fiber substrate and which comprises a bottom electrode/p-type semiconductor layer pattern/n-type semiconductor layer pattern/insulating layer/first contact hole/top gate electrode/interlayer insulating layer/second contact hole/top electrode.

As described above, according to the method for forming a pattern for electronic devices of the present invention, it is possible to easily and directly manufacture a pattern for electronic devices on a fiber filament substrate using a maskless exposure apparatus. In addition, since the maskless exposure apparatus can be controlled by a computer program, it is possible to form a very fine pattern on a fiber filament substrate. Further, it is possible, by applying the method for forming a pattern for electronic devices, to form an electronic device such as a transistor, an inverter, and a ring oscillator directly on a fiber filament substrate by a continuous process.

Hereinafter, the present invention will be described in more detail with reference to examples. It will be apparent to those skilled in the art that the following examples are for illustrative purposes only and that the scope of the present invention is not construed as being limited thereto.

EXAMPLES

Example 1: Formation of a Metal Electrode on a Cylindrical Fiber Filament Substrate A positive photoresist (GXR601, AZ Electronic Materials) was coated on a cylindrical fiber filament substrate (CCC1310-J9, Thorlabs) having a radius of curvature of 125 µm and whose external protective film has been removed, to form a photoresist film. After a pre-bake treatment for 1 minute on a hot plate at 100° C., the photoresist film was subjected to an exposure process using a maskless exposure apparatus µPGUV-N manufactured by Heidelberg instruments. Then, after an after-bake treatment for 1 minute on a hot plate at 100° C., it was immersed in a developer (AZ 300 MIF, AZ Electronic Materials) and development was performed for 2 minutes to dissolve the exposed portion of the positive photoresist of the fiber filament substrate, leaving only the unexposed portion, to form a photoresist pattern. After the development process, the remaining developer was washed out sufficiently with deionized water, followed by a hard-bake treatment for 1 minute on a hot plate at 100° C. Then, an aluminum (Al) deposition process was performed on the photoresist pattern and the cylindrical fiber filament substrate on which the photoresist pattern is not formed, to form an aluminum patterning layer. Then, the photoresist pattern formed on the cylindrical fiber substrate was removed to form a plurality of aluminum pattern arrays in which each pattern has an area of 5 µm×5 µm on the cylindrical fiber filament substrate. The pattern array was manufactured to have a thickness of 30 nm.

Example 2: Formation of a Metal Electrode on a Cylindrical Fiber Filament Substrate The same process as that of Example 1 was performed except that the drawing for the computer program used in the exposure process was changed, to manufacture an aluminum pattern array in which each aluminum pattern has a size of 10 μm×10 μm.

Example 3: Formation of a Metal Electrode on a Cylindrical Fiber Filament Substrate The same process as that of Example 1 was performed except that the drawing for the computer program used in the exposure process was changed, to manufacture an aluminum pattern array in which each aluminum pattern has a size of 20 μm×20 μm.

Example 4: Formation of a Metal Electrode on a Cylindrical Fiber Filament Substrate The same process as that of Example 1 was performed except that the drawing for the computer program used in the exposure process was changed, to manufacture an aluminum pattern including 5 pattern arrays. In the maskless exposure process, 5 different drawings were used for the computer program to manufacture aluminum pattern arrays having different shapes from one another.

Example 5: Formation of a Metal Electrode on a Cylindrical Fiber Filament Substrate An aluminum (Al) deposition process was performed on a cylindrical fiber filament substrate (CCC1310-J9, Thorlabs) having a radius of curvature of 125 μm and whose external protective film has been removed, to form an aluminum patterning layer. Then, a negative photoresist (SU8, MicroChem) was coated to form a photoresist film. After a pre-bake treatment for 1 minute on a hot plate at 100° C., the photoresist film was subjected to an exposure process using pPGUV-N manufactured by Heidelberg instruments. Then, after an after-bake treatment for 1 minute on a hot plate at 100° C., it was immersed in a developer (SU8 developer, MicroChem) and development was performed for 2 minutes to leave only the exposed portion of the negative photoresist of the fiber filament substrate and thereby to form a photoresist pattern. After the development process, the remaining developer was washed out sufficiently with deionized water, followed by a hard-bake treatment for 1 minute on a hot plate at 100° C. Then, the aluminum patterning layer was etched using the photoresist pattern to form a plurality of aluminum pattern arrays in which each pattern has a width of 5 μm×5 μm on a cylindrical fiber filament substrate. Then, the photoresist pattern was removed. The aluminum pattern array was manufactured to have a thickness of 30 nm.

Example 6: Formation of a Metal Electrode on a Cylindrical Fiber Filament Substrate The same process as that of Example 5 was performed except that the drawing for the computer program used in the exposure process was changed, to manufacture an aluminum pattern including 5 pattern arrays. In the maskless exposure process, 5 different drawings were used for the computer program to manufacture aluminum pattern arrays having different shapes from one another.

Example 7: Formation of a Transistor on a Fiber Filament Substrate

The same procedure as the method for manufacturing an aluminum pattern array of Example 1 was repeatedly performed with varying the material of each layer of the transistor. First, a bottom electrode layer was formed on a fiber filament electrode by the above method using Au and Cr as the material. The formed Cr layer had a thickness of 10 nm and the Au layer had a thickness of 30 nm. Then, a semiconductor layer pattern was formed on the bottom electrode layer by the same method using IGZO as the material. The IGZO layer had a thickness of 15 nm. Then, a dielectric layer was formed on the semiconductor layer pattern by the same method using $Al_2O_3$ as the material. The $Al_2O_3$ layer had a thickness of 15 nm. Then, a top electrode was formed on the dielectric layer by the same method using Al as the material. The Al layer had a thickness of 30 nm.

Test Example 1: Investigation of the Surface of a Fiber Substrate in Each Patterning Process (1)

FIG. 13A and FIG. 13B are photographs showing the surface of a fiber filament substrate in each step of Example 1 and Example 5. From FIG. 13A and FIG. 13B, it can be seen that a metal pattern was uniformly formed on the monofilament fiber.

Test Example 2: Investigation of the Surface of Patterns (1)

Figure 14A:
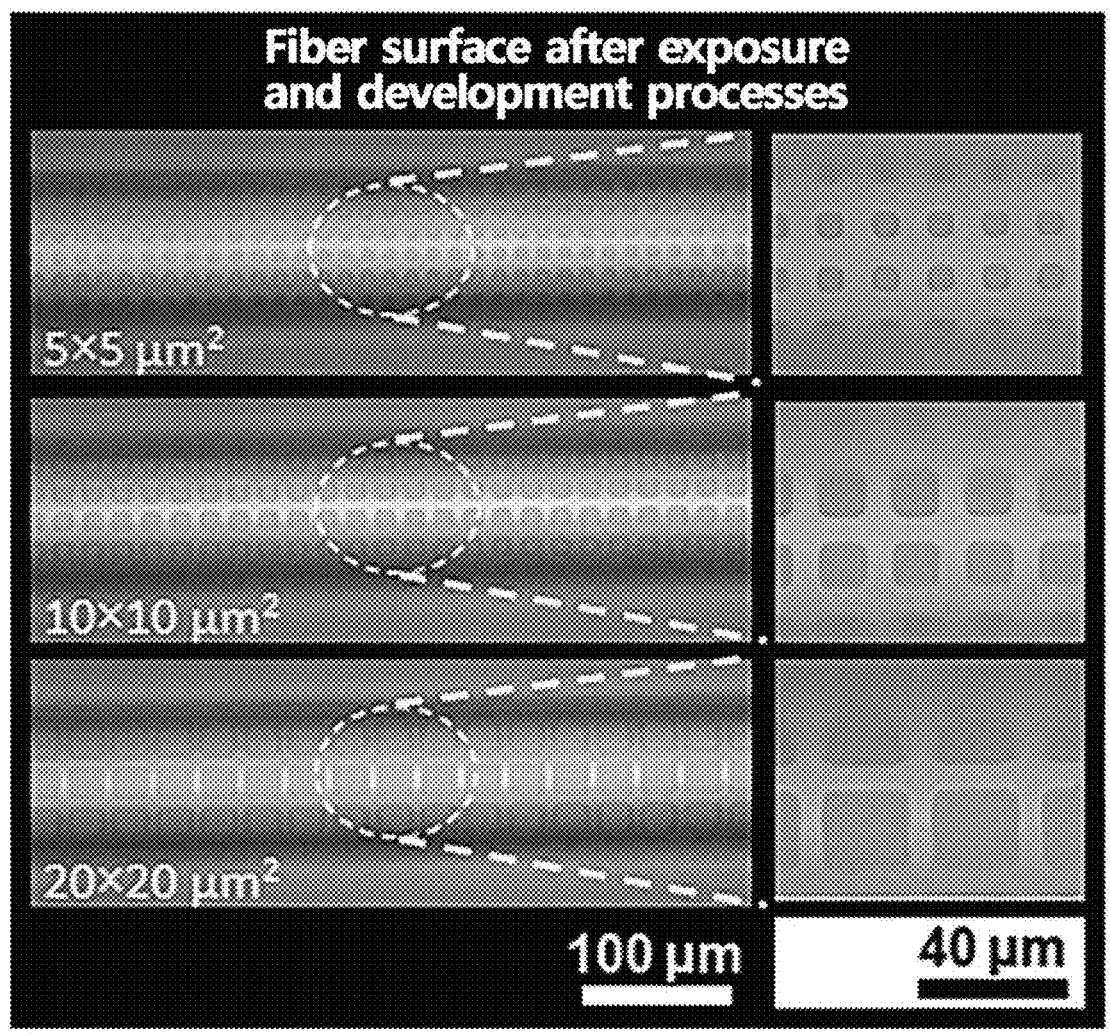
FIG. 14A shows microscope images of the surface of a fiber filament substrate including a photoresist pattern for electronic devices after a development process.
Figure 14B:
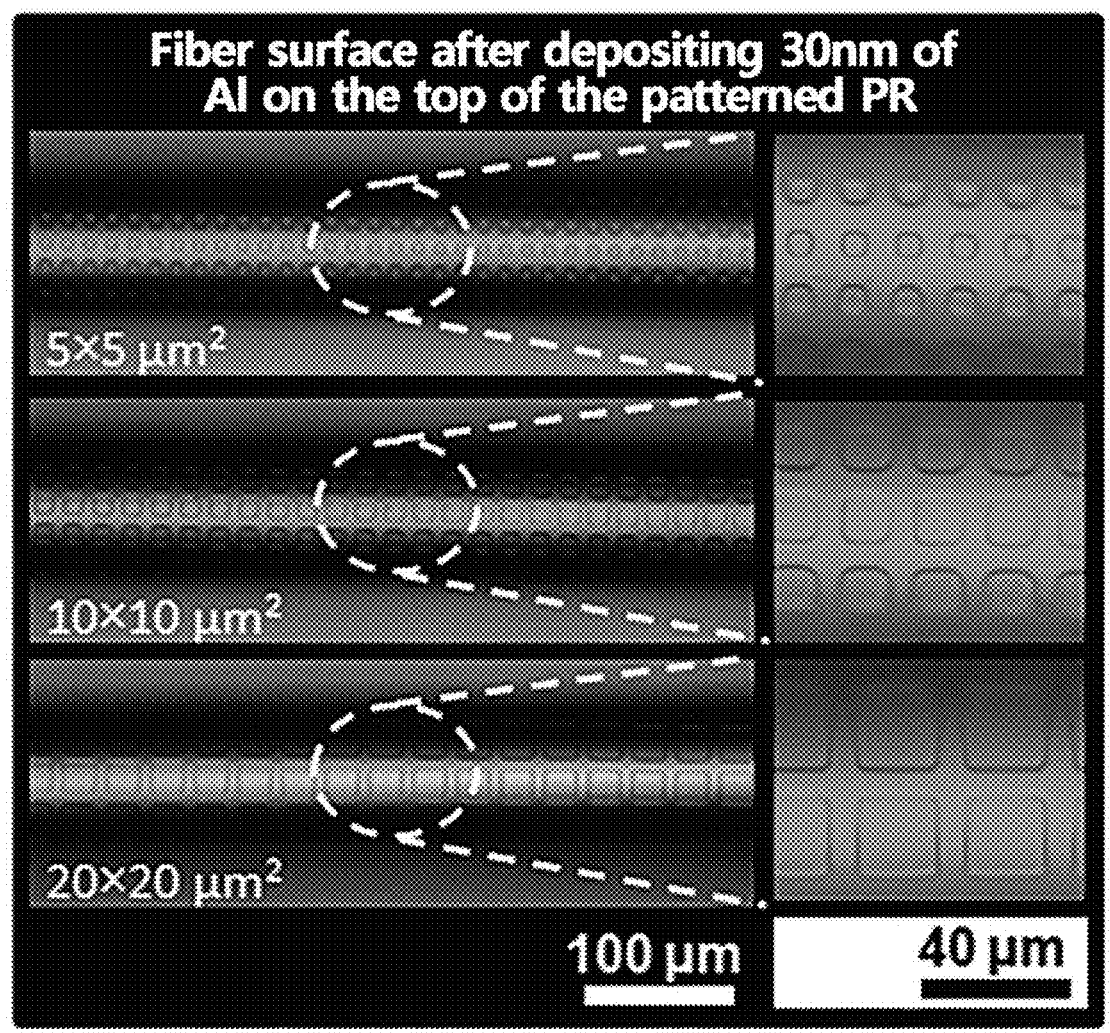
FIG. 14B shows microscope images of the surface after 30 nm of aluminum is deposited on the top of the photoresist pattern.
Figure 14C:
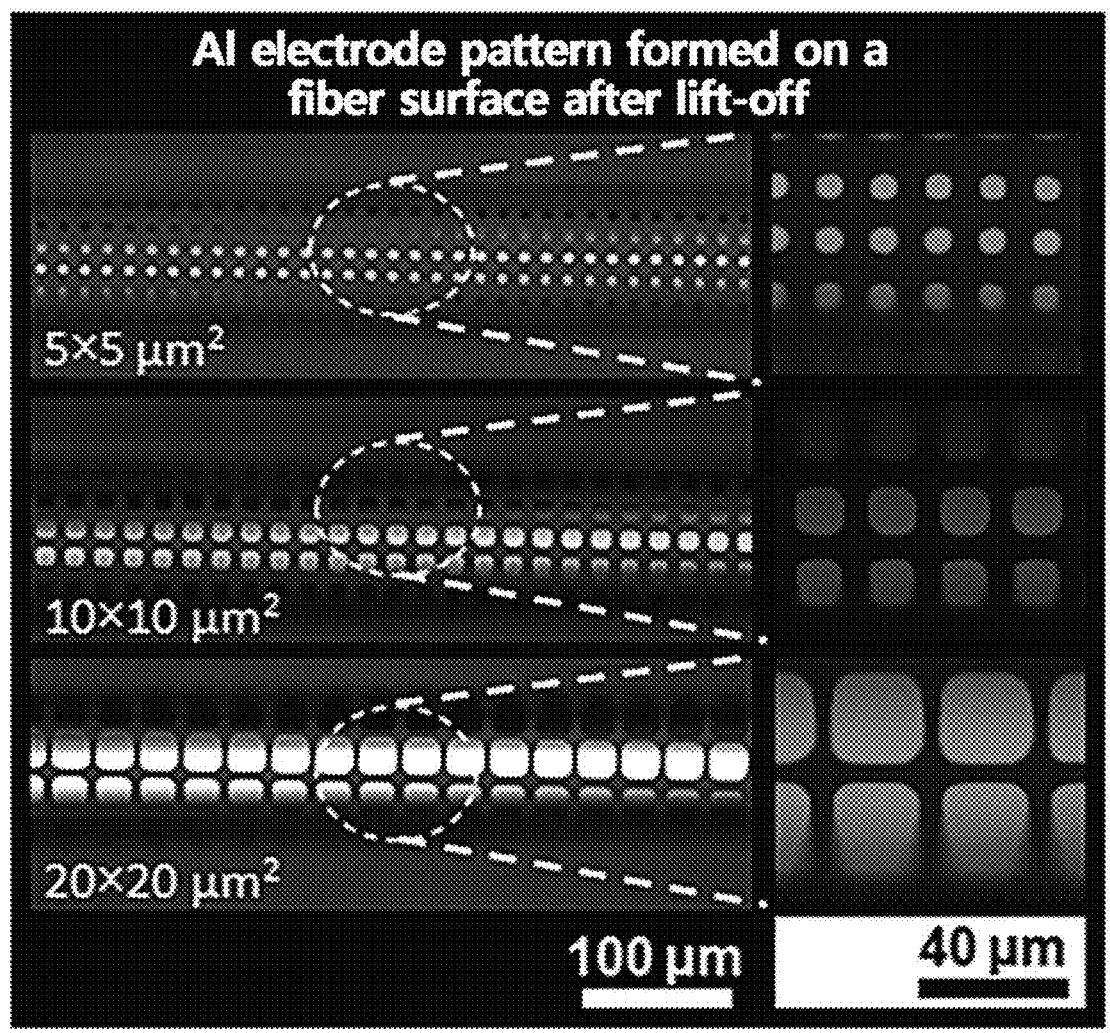
FIG. 14C shows a microscope image of the surface of a fiber substrate on which a 30 nm thick aluminum pattern array (20 μm×20 μm) has been formed after a lift-off process.

FIG. 14A shows microscope images of the surface of a fiber filament substrate including a photoresist pattern for electronic devices after a development process. FIG. 14B shows microscope images of the surface after 30 nm of aluminum is deposited on the photoresist pattern, and FIG. 14C shows a microscope image of the surface of a fiber substrate on which a 30 nm thick aluminum pattern array (20 μm×20 μm) has been formed after a lift-off process.

The drawings show that, despite the radius of curvature of the fiber filament substrate, aluminum patterns were formed spaced apart from one another at regular intervals by an exposure process, a metal deposition process and then a lift-off process and the like. In addition, it can be seen that the aluminum pattern array had a thickness of about 30 nm and was formed spaced apart from one another at regular intervals. Further, it can be seen that each aluminum pattern was spaced apart at very regular intervals and formed precisely.

Test Example 3: Investigation of the Surface of Patterns (2)

FIG. 15 shows microscope image of an aluminum pattern array manufactured according to Example 4 and Example 6. From the upper portion and the lower portion of FIG. 15, it can be seen that aluminum pattern arrays of various shapes can be formed on a monofilament. Thus, it can be understood that it is possible to form various shapes of electrode patterns, wiring patterns and the like on a monofilament by applying it.

Figure 18A:
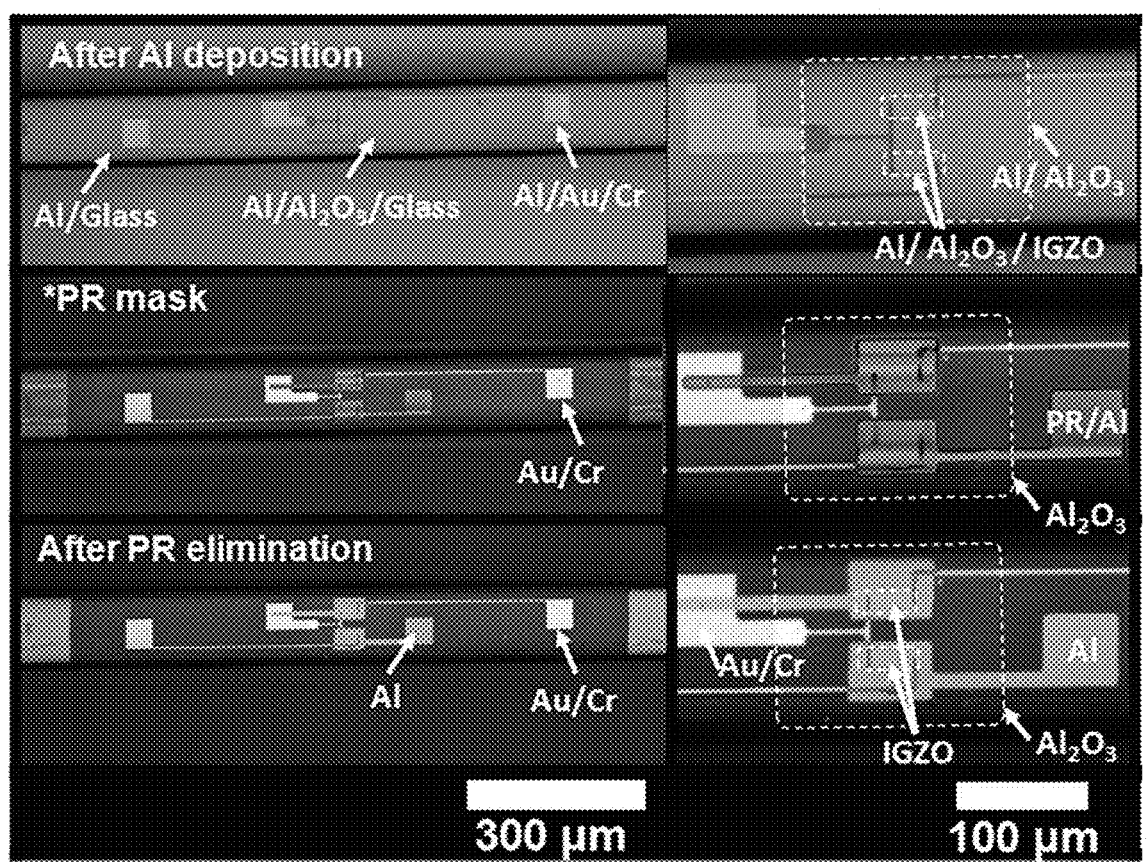
FIG. 18A shows microscope images of a transistor according to one embodiment of the present invention, each respectively representing the transistor formed on a fiber filament substrate after performing an aluminum deposition process, after formation of a photoresist pattern, and after removing the photoresist pattern.
Figure 18B:
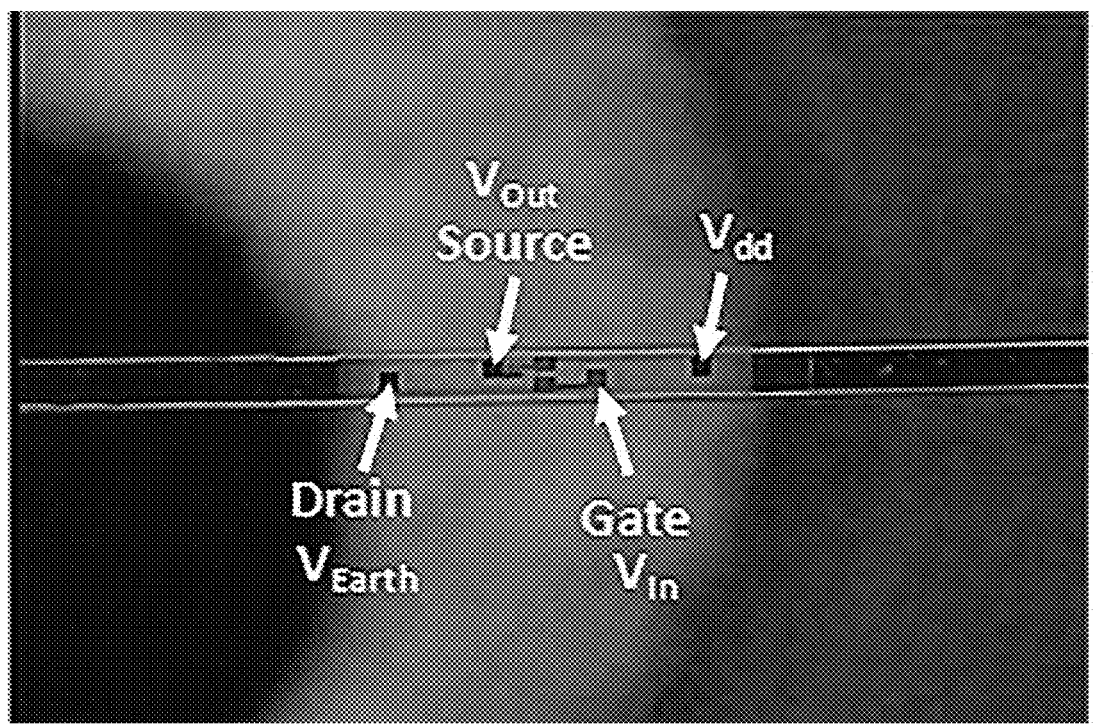
FIG. 18B shows a photograph of a transistor formed on a fiber filament substrate comprising source, drain, and gate electrodes.

Test Example 4: Investigation of the Surface of a
Transistor in Each Patterning Process FIG. 18A shows microscope images of the transistor according to Example 7 of the present invention, each respectively representing the transistor formed on a fiber filament substrate after performing an aluminum deposition process, after formation of a photoresist pattern, and after removing the photoresist pattern. FIG. 18B shows a photograph of a transistor comprising source, drain, and gate electrodes which is formed on a fiber filament substrate. Thus, it can be understood that a transistor according to one embodiment of the present invention has a transistor structure formed on a monofilament.

Test Example 5: Analysis of the Current
Characteristics of a Transistor

Figure 19A:
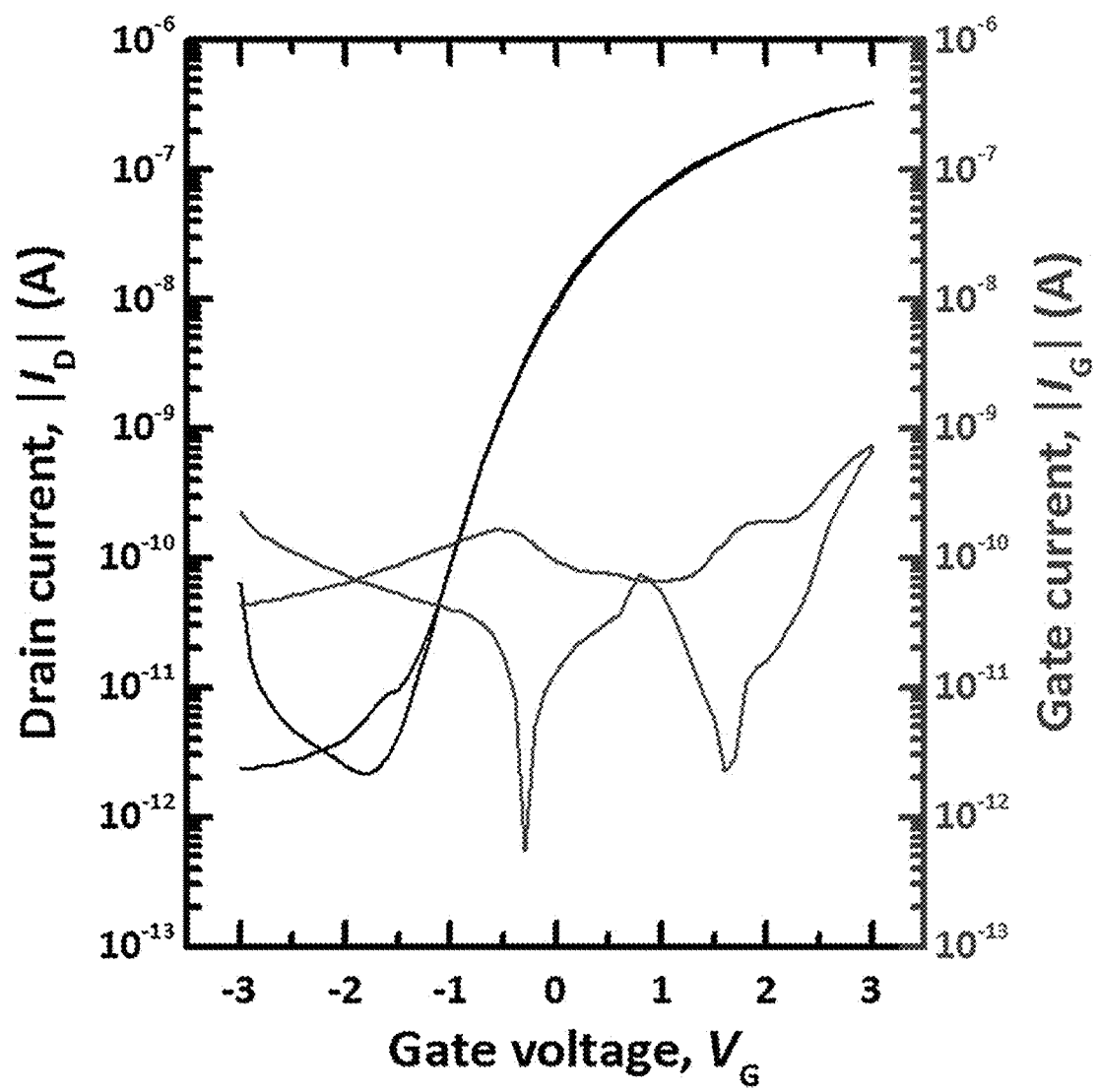
FIG. 19A shows the drain current-gate voltage characteristics of a transistor according to one embodiment of the present invention.
Figure 19B:
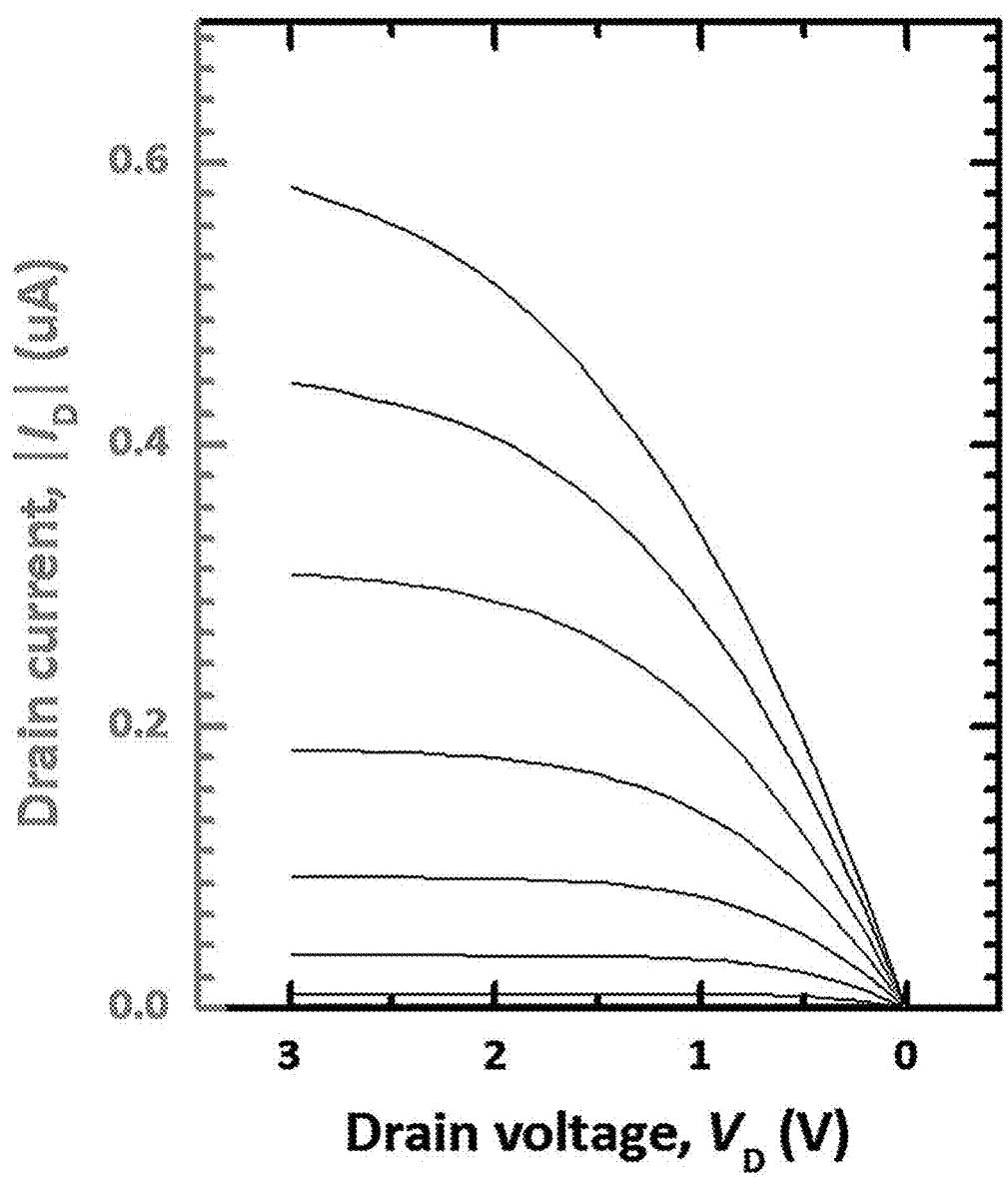
FIG. 19B shows the drain current-gate voltage characteristics of a transistor according to one embodiment of the present invention.

FIG. 19A shows the drain current-gate voltage characteristics of the transistor according to Example 7 of the present invention. FIG. 19B shows the drain current-drain voltage characteristics of a transistor according to one embodiment of the present invention.

Figure 20A:
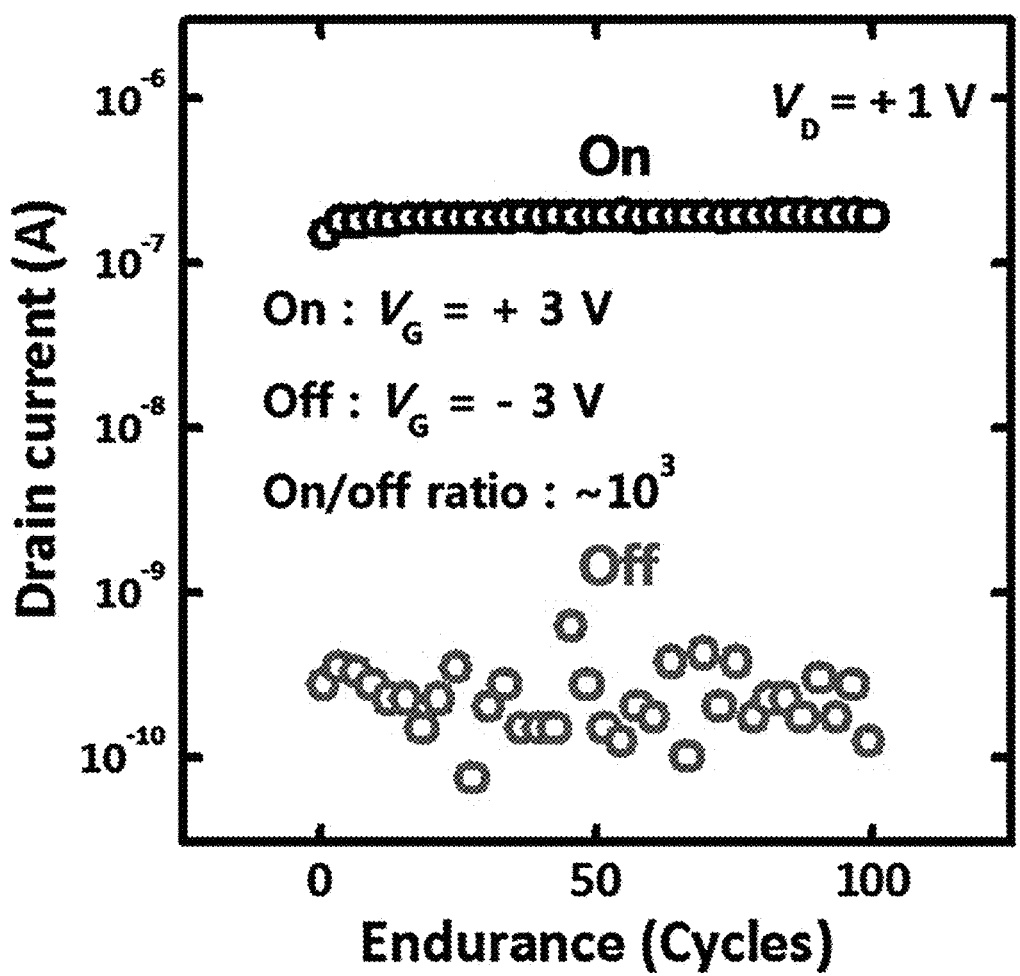
FIG. 20A shows the on/off ratio of the current flowing between the source electrode and the drain electrode in a transistor according to one embodiment of the present invention.
Figure 20B:
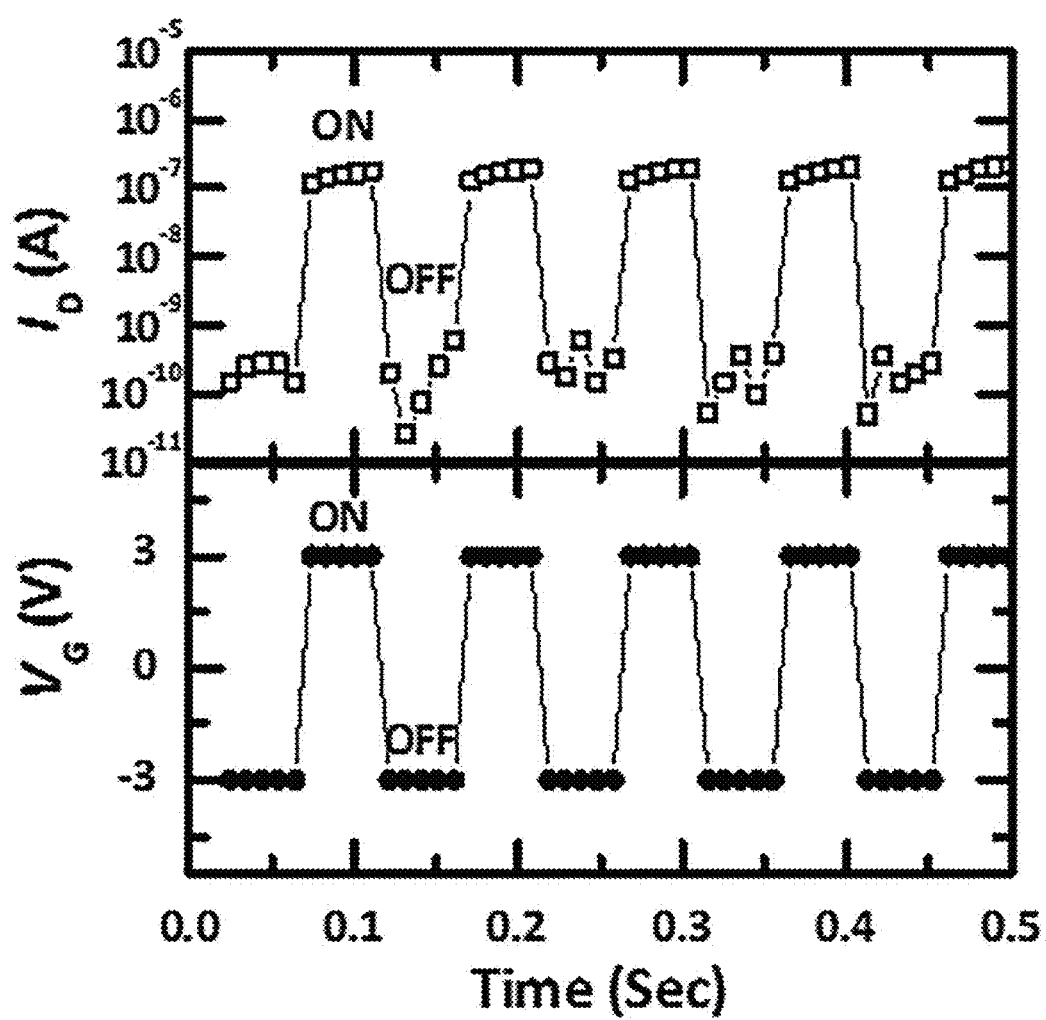
FIG. 20B shows the switching characteristics of a transistor according to one embodiment of the present invention, measured by repeating on/off switching about every 0.1 second.

FIG. 20A shows the on/off ratio of the current flowing between the source electrode and the drain electrode in the transistor according to Example 7 of the present invention. FIG. 20B shows the switching characteristics of the transistor according to Example 7 of the present invention, measured by repeating on/off switching about every 0.1 second. The results show that it has excellent switching characteristics.

From the above results, it can be seen that the transistor formed on a fiber filament substrate according to one embodiment of the present invention has the same current-voltage characteristics as conventional transistors formed on a semiconductor substrate.

The embodiments of the present invention described above should not be construed as limiting the technical idea of the present invention. The scope of the present invention is defined only by the appended claims. Various other improvements and modifications to this invention may occur to those skilled in the art and those improvements and modifications will fall within the scope of the present invention.

What is claimed is:

1. A method for forming a pattern for electronic devices on a fiber filament substrate, the method comprising:
    adjusting a surface roughness of a fiber filament substrate;
    forming a photoresist film on the fiber filament substrate;
    performing an exposure process, a photocuring process, and a development process on the photoresist film to form a photoresist pattern;
    performing a deposition process on a top surface of the photoresist pattern and a top surface of the fiber filament substrate on which the photoresist pattern is not formed to form a patterning layer for electronic devices; and
    removing the photoresist pattern and the patterning layer for electronic devices formed on the photoresist pattern from the fiber filament substrate to form a pattern for electronic devices,
    wherein the exposure process is performed using a maskless exposure apparatus.

2. The method according to claim 1,
wherein the fiber filament substrate has a root mean square roughness of less than 50 nm.

3. The method according to claim 1,
wherein the fiber filament substrate has an aspect ratio of 100 or more.

4. The method according to claim 1,
wherein the maskless exposure apparatus comprises a maskless exposure unit for directly exposing the photoresist film using exposure data generated based on design data for the fiber filament substrate, and
wherein the design data comprises pattern information for electronic devices predetermined for at least one conductive pattern to be formed on the fiber filament substrate and predetermined pad layout information of an electronic component to be mounted or formed on the pattern for electronic devices.

5. The method according to claim 4,
wherein the maskless exposure unit comprises a scaling correction value generating unit for measuring an elongation and contraction of the fiber filament substrate after photocuring and development relative to the fiber filament substrate before exposure and for generating a scaling correction value to correct a position and shape of the exposure data based on the measured elongation and contraction.

6. The method according to claim 1,
wherein the pattern for electronic devices comprises a pattern array for electronic devices comprising a plurality of patterns for electronic devices, and wherein the patterns for electronic devices of the pattern array have different areas from one another.

7. The method according to claim 6,
wherein the pattern array for electronic devices is divided into a first region and a second region, and
wherein the patterns for electronic devices in the first region have a smaller area than the patterns for electronic devices in the second region.

8. The method according to claim 1,
wherein the pattern for electronic devices comprises a pattern array for electronic devices comprising a plurality of patterns for electronic devices, and wherein the patterns for electronic devices of the pattern array are arranged such that the patterns have different shapes from one another.

9. The method according to claim 1,
wherein the pattern for electronic devices is formed to a thickness of 1 nm to 1 µm.

10. The method according to claim 1,
wherein the exposure process is performed at a temperature of −20° C. to 100° C. and a pressure of $1 \times 10^{-8}$ torr to 1,500 torr.

11. The method according to claim 1,
wherein the fiber filament substrate comprises at least one selected from the group consisting of a transparent glass fiber, an opaque glass fiber, a metal fiber, a transparent insulating polymeric fiber, a transparent conductive polymeric fiber, an opaque conductive polymeric fiber, an inorganic semiconductor fiber, an organic semiconductor fiber, and an oxide semiconductor fiber.

12. The method according to claim 1,
wherein the fiber filament substrate has a cylindrical, trigonal prism, square pillar, or polyprism shape.

13. The method according to claim 1,
wherein the pattern for electronic devices is at least one selected from the group consisting of a source electrode, a drain electrode, an insulating layer, and wiring of an electronic device.

14. The method according to claim 1,
wherein the pattern for electronic devices is formed by a continuous manufacturing process.

15. A method for manufacturing fiber-type electronic devices comprising performing the method for forming a pattern for electronic devices on a fiber filament substrate according to claim 1.

16. A method for forming a pattern for electronic devices on a fiber filament substrate, the method comprising:
- forming a patterning layer for electronic devices on a fiber filament substrate;
- forming a photoresist film on the patterning layer for electronic devices;
- performing an exposure process, a photocuring process, and a development process on the photoresist film to form a photoresist pattern;
- performing an etching process on the patterning layer for electronic devices using the photoresist pattern as a mask pattern to form a pattern for electronic devices; and
- removing the photoresist pattern,
- wherein the exposure process is performed using a maskless exposure apparatus.

\* \* \* \* \*